(12) United States Patent
Wang et al.

(10) Patent No.: US 12,416,862 B2
(45) Date of Patent: Sep. 16, 2025

(54) APPARATUS, SYSTEM AND METHOD

(71) Applicant: Taiwan Semiconductor Manufacturing Co., Ltd., Hsinchu (TW)

(72) Inventors: Po-Han Wang, Hsinchu (TW); Yu-Hsiang Hu, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,104

(22) Filed: Aug. 9, 2023

(65) Prior Publication Data

US 2023/0384682 A1 Nov. 30, 2023

Related U.S. Application Data

(62) Division of application No. 16/806,468, filed on Mar. 2, 2020, now Pat. No. 12,242,197.

(60) Provisional application No. 62/869,515, filed on Jul. 1, 2019.

(51) Int. Cl.
  G03F 7/38 (2006.01)
  G03F 7/00 (2006.01)
  H01L 21/027 (2006.01)

(52) U.S. Cl.
  CPC ............ *G03F 7/38* (2013.01); *G03F 7/70908* (2013.01); *H01L 21/0273* (2013.01)

(58) Field of Classification Search
  CPC ..... G03F 7/38; G03F 7/70908; G03F 7/70916
  See application file for complete search history.

(56) References Cited

U.S. PATENT DOCUMENTS

| 2002/0064380 | A1 | 5/2002 | Reiker |
| 2005/0195480 | A1 | 9/2005 | Brown et al. |
| 2009/0095221 | A1 | 4/2009 | Tam et al. |
| 2009/0181226 | A1 | 7/2009 | Ning et al. |
| 2010/0025856 | A1* | 2/2010 | Kawamura ....... H01L 21/02304 257/773 |
| 2010/0255428 | A1 | 10/2010 | Chen et al. |
| 2012/0000490 | A1* | 1/2012 | Chung ............. C23C 16/45576 134/22.12 |
| 2012/0161405 | A1 | 6/2012 | Mohn et al. |
| 2017/0101713 | A1 | 4/2017 | Wang et al. |

* cited by examiner

*Primary Examiner* — Daborah Chacko-Davis
(74) *Attorney, Agent, or Firm* — Slater Matsil, LLP

(57) ABSTRACT

An apparatus and a method for effectively exhausting evaporated material are provided. In an embodiment the apparatus includes a hot plate and an exhaust hood assembly suspended over the hot plate. The exhaust hood assembly includes a trench plate, a cover plate over the trench plate and a single exhaust pipe header over and attached to a single exhaust opening of the cover plate. During operation, the exhaust hood assembly reduces the amount of condensation and also collects any remaining condensation in order to help prevent condensation from impacting further manufacturing steps.

20 Claims, 16 Drawing Sheets

APPARATUS, SYSTEM AND METHOD

PRIORITY CLAIM

This application is a divisional of U.S. patent application Ser. No. 16/806,468, filed on Mar. 2, 2020, entitled "Apparatus, System and Method," which claims the benefit of U.S. Provisional Application No. 62/869,515, filed on Jul. 1, 2019, which applications are hereby incorporated herein by reference.

BACKGROUND

Integrated circuits comprising semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. A series of chemical and physical processes may be performed during the fabrication process flow, using equipment with processing chambers that are often maintained at low pressure or partial vacuum.

The integrated circuit industry continues to improve the integration density of various electronic components (e.g., transistors, diodes, resistors, capacitors, etc.) by continual reduction in minimum feature size, which allows more components to be integrated into a given area, thereby lowering the cost of integrated circuits. Maintaining continual reduction in manufacturing cost requires a high efficiency integrated circuit fabrication facility and infrastructure that may give rise to additional problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
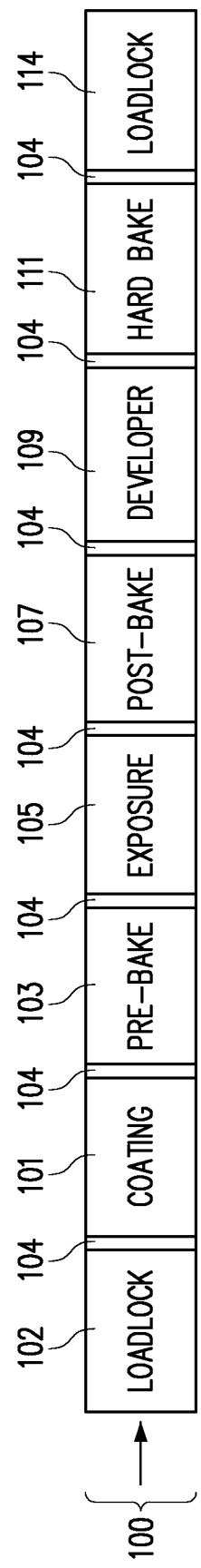
FIG. 1 illustrates a photoresist track system in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a wafer baking station utilized in the manufacturing of semiconductor devices. The wafer baking station described herein may be any semiconductor wafer baking apparatus such as a pre-development bake station (e.g., pre-bake station), a post-development station (e.g., post-bake station), a hard bake station, a diffusion bake station, or the like. Features of one embodiment may also be applied and suitably incorporated as features of other embodiments described herein. Other embodiments may also be applied, however, to other manufacturing apparatuses.

With reference now to FIG. 1, there is shown a photoresist track system 100 with a first loadlock chamber 102, a coating station 101, a pre-bake station 103, an exposure station 105, a post-bake station 107, a developer station log, an optional hard bake station 111, a plurality of the transfer stations 104, and a second loadlock chamber 114. In an embodiment, the photoresist track system 100 is a track system for processing a substrate 201 (not illustrated in FIG. 1 but illustrated and discussed below with respect to FIG. 2B), and is a self-enclosed, fully contained system into which the substrate 201 may be initially placed. Once within the photoresist track system 100, the substrate 201 may be moved from station to station and processed without breaking the interior environment, thereby isolating the substrate 201 from the ambient environment that may contaminate or otherwise interfere with the processing of the substrate 201.

In an embodiment, the photoresist track system 100 receives the substrate 201 into the photoresist track system 100 through, e.g., the first loadlock chamber 102. The first loadlock chamber 102 opens to the exterior atmosphere and receives the substrate 201. Once the substrate 201 is located within the first loadlock chamber 102, the first loadlock chamber 102 can close, isolating the substrate 201 from the exterior atmosphere. Once isolated, the first loadlock chamber 102 can then have the remaining exterior atmosphere evacuated in preparation for moving the substrate 201 into the remainder of the photoresist track system 100 through, e.g., a transfer station 104.

The transfer station 104 may be one or more robotic arms (not individually illustrated in FIG. 1) that can grip, move, and transfer the substrate 201 from the first loadlock chamber 102 to, e.g., the coating station 101. In an embodiment, the robotic arms may extend into the first loadlock chamber 102, grip the substrate 201, and transfer the substrate 201 into the transfer station 104. Once inside, the transfer station 104 may have doors that close to isolate the transfer station 104 from the first loadlock chamber 102 so that the first loadlock chamber 102 may again be opened to the exterior atmosphere without contaminating the remainder of the photoresist track system 100. Once isolated from the first loadlock chamber 102, the transfer station 104 may open to the next station, e.g., the coating station 101, and the robotic arms, still holding the substrate 201, may extend into the next station and place the substrate 201 for further processing.

In an embodiment, and as illustrated in FIG. 1, the transfer station 104 between the first loadlock chamber 102 and the coating station 101 transfers the substrate 201 directly from the first loadlock chamber 102 into the coating station 101. However, other processing stations (e.g., process chambers) may be located between the first loadlock chamber 102 and the coating station 101. For example, cleaning stations, temperature control stations, or any other type of station which may be used to prepare the substrate 201 to receive a photoresist 211 (not illustrated in FIG. 1 but illustrated and discussed below with respect to FIG. 2B) may also be included. Any suitable type or number of stations may be used, and all such stations are fully intended to be included within the scope of the embodiments.

Additionally, FIG. 1 illustrates a plurality of separate transfer stations 104 respectively between each of the processing stations (e.g., between the first loadlock chamber 102 and the coating station 101, between the coating station 101 and the exposure station 105, etc.). However, this is intended to be illustrative and is not intended to be limiting upon the embodiments. The precise number of transfer stations will depend at least in part upon the overall structural layout of the various processing stations. For example, if the processing stations are arranged in a linear fashion (as illustrated in FIG. 1), then there may be individual transfer stations between each process station of the photoresist track system 100. However, in other embodiments in which the various processing stations or groups of processing stations are arranged, e.g., in one or more circles, then a single transfer station may be utilized to move the substrates being processed (e.g., substrate 201) into and out of the various process chambers. All such arrangements are fully intended to be included within the scope of the embodiments.

Figure 2A:
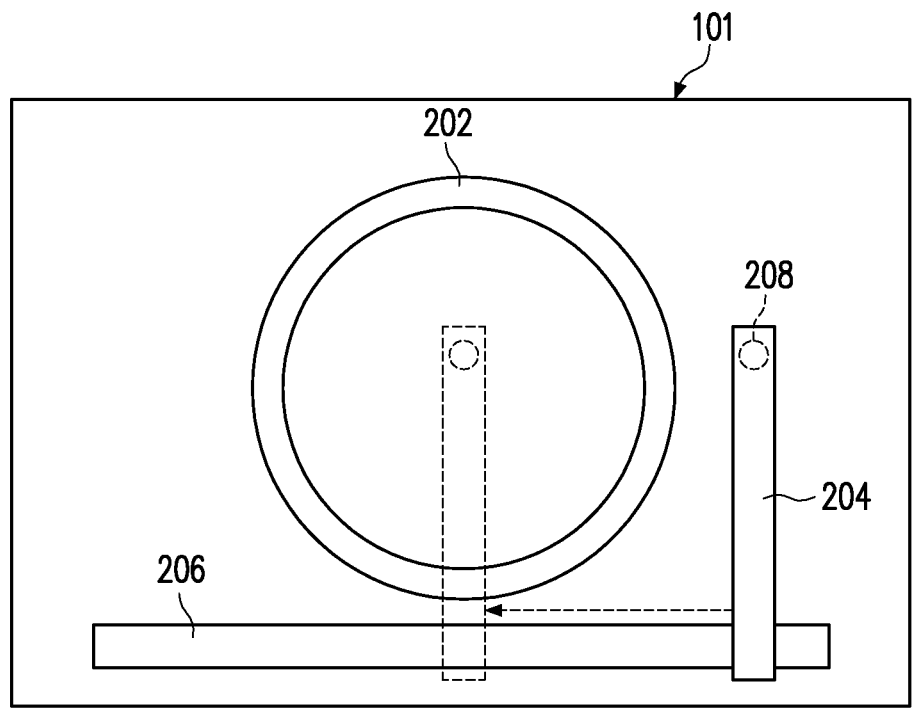
FIG. 2A-2B illustrates an application of a photoresist in accordance with an embodiment.
Figure 2B:
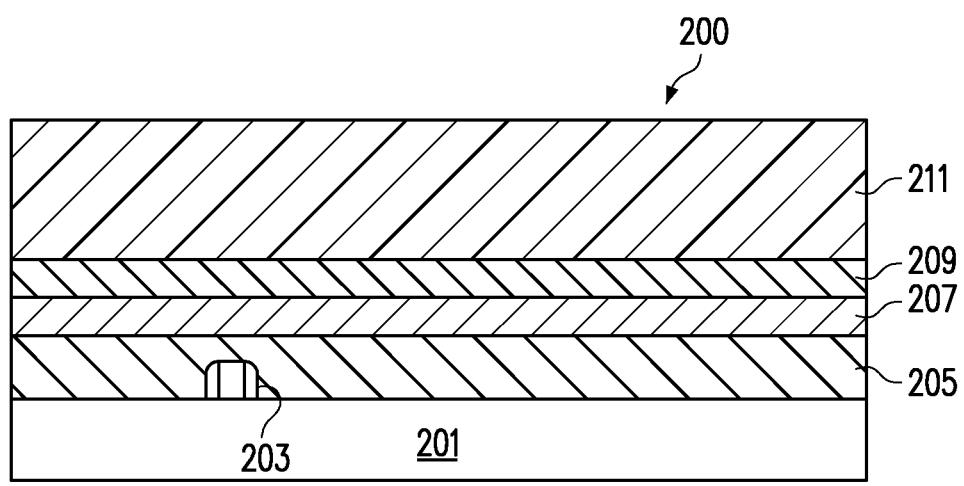

FIG. 2A illustrates a top view of one embodiment of the coating station 101 into which the transfer station 104 places the substrate 201, and FIG. 2B illustrating a cross-sectional view of the substrate 201 after being processed within the coating station 101. In an embodiment, the coating station 101 is a spin-on station and comprises a rotating chuck 202, a dispensing arm 204, and a track 206. The rotating chuck 202 receives the substrate 201 from the transfer station 104 and holds the substrate 201 during processing.

The dispensing arm 204 has a nozzle 208 in order to dispense photoresist 211 onto the substrate 201. In an embodiment, the dispensing arm 204 may be moveable relative to the rotating chuck 202 so that the dispensing arm 204 can move over the substrate 201 (illustrated in FIG. 2A by the arrow and dispensing arm illustrated in dashed lines) in order to evenly dispense the photoresist 211. The dispensing arm 204 may move back and forth with the help of the track 206, which provides a fixed reference to assist the dispensing arm 204 in its movement.

During operation, the rotating chuck 202, holding the substrate 201, can rotate at a speed of about 300 rpms to about 7000 rpms, although any suitable speed may be utilized. While the rotating chuck 202 is rotating, the dispensing arm 204 may move over the substrate 201 and begin dispensing the photoresist 211 onto the substrate 201 through the nozzle 208. The rotation of the substrate 201 helps the photoresist 211 spread evenly across the substrate 201, such as to a thickness of between about 10 nm and about 300 nm, such as about 150 nm.

However, the spin-on configuration illustrated in FIG. 2A and described above is intended to be illustrative only and is not intended to limit the embodiments. Rather, any suitable configuration for the coating station 101 that may be used to apply the photoresist 211, such as a dip coating configuration, an air-knife coating configuration, a curtain coating configuration, a wire-bar coating configuration, a gravure coating configuration, a lamination configuration, an extrusion coating configuration, combinations of these, or the like, may also be utilized. All such suitable configurations for the coating station 101 are fully intended to be included within the scope of the embodiments.

FIG. 2B illustrates a semiconductor device 200 with the substrate 201 after the dispensing of the photoresist 211. Also illustrated as being formed on the substrate 201 (prior to the application of the photoresist 211) are active devices 203 on the substrate 201, an interlayer dielectric (ILD) layer (e.g., the ILD layer 205) over the active devices 203, metallization layers 207 over the ILD layer 205, and a layer to be patterned 209 over the ILD layer 205. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 203 are represented in FIG. 2B as a single transistor for illustration purpose. However, a wide variety of active devices such as capacitors, resistors, inductors and the like may be used to generate the desired structural and functional requirements of the design for the semiconductor device 200. The active devices 203 may be formed using any suitable methods either within or else on the surface of the substrate 201.

The ILD layer 205 may comprise a material such as boron phosphorous silicate glass (BPSG), although any suitable dielectrics may be used for either layer. The ILD layer 205 may be formed using a process such as PECVD, although other processes, such as LPCVD, may also be used. The ILD layer 205 may be formed to a thickness of between about 100 Å and about 3,000 Å.

The metallization layers 207 are formed over the substrate 201, the active devices 203, and the ILD layer 205, and are designed to connect the active devices 203 to form functional circuitry. While illustrated in FIG. 2B as a single layer, the metallization layers 207 may be formed of alternating layers of dielectric and conductive material, and may be formed through any suitable process (such as deposition, damascene, dual damascene, etc.). In an embodiment, there may be four to twelve layers of metallization separated from the substrate 201 by the ILD layer 205, but the precise number of metallization layers 207 is dependent upon the design of the semiconductor device 200.

The layer to be patterned 209 or otherwise processed using the photoresist 211 is formed over the metallization layers 207. The layer to be patterned 209 may be an upper layer of the metallization layers 207, a dielectric layer (such as a passivation layer) formed over the metallization layers 207, or may even be the substrate 201 itself. In an embodiment, in which the layer to be patterned 209 is a metallization layer, the layer to be patterned 209 may be formed of a conductive material using processes similar to the processes used for the metallization layers (e.g., damascene, dual damascene, deposition, etc.). Also, if the layer to be patterned 209 is a dielectric layer, it may be formed of a dielectric material using processes such as deposition, oxidation, or the like.

However, while materials, processes, and other details are described in the embodiments, they are merely intended to be illustrative of embodiments, and are not intended to be limiting in any fashion. Rather, any suitable layer made of any suitable material, by any suitable process, and any suitable thickness, may also be used. All such layers are fully intended to be included within the scope of the embodiments.

The photoresist 211 is applied to the layer to be patterned 209. In an embodiment the photoresist 211 includes a polymer resin along with one or more photoactive compounds (PACs) in a solvent. Additionally, if desired, other additives, such as cross-linking additives, surfactants, etc. may also be included within the solvent and the photoresist 211. Any suitable composition may be utilized.

Figure 3A:
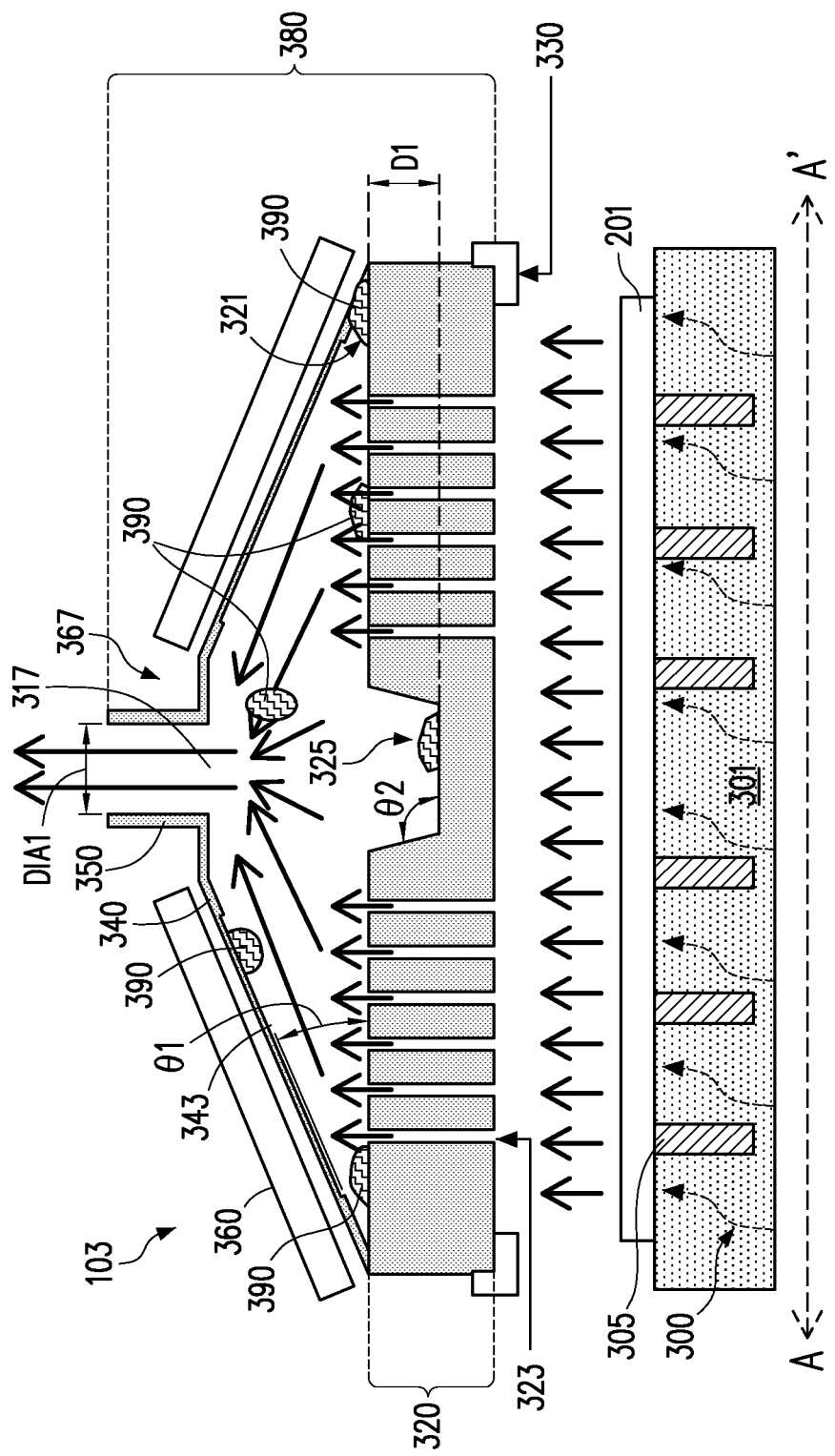
FIGS. 3A-3H illustrate various views of a pre-bake station used during a pre-bake process, and various views of some components of the pre-bake station, in accordance with an embodiment.
Figure 3B:
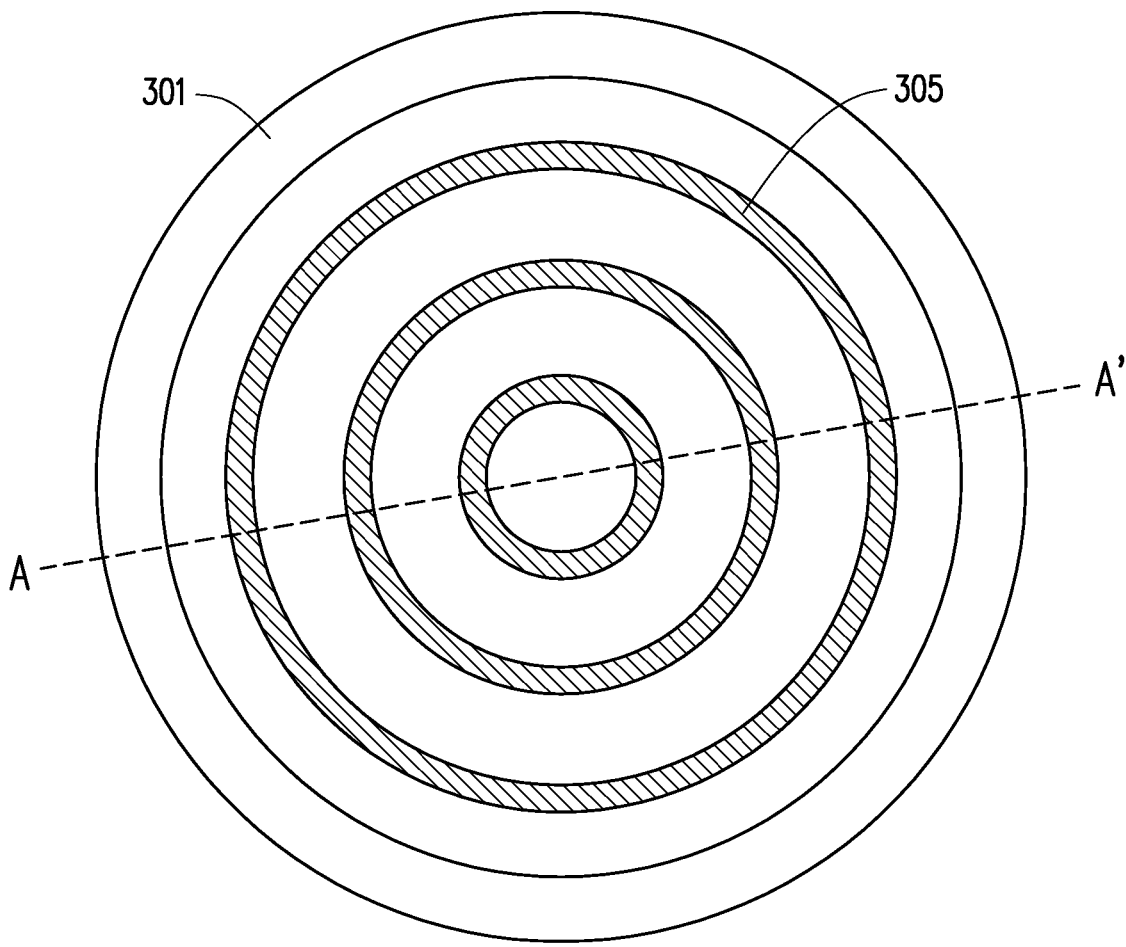
Figure 3C:
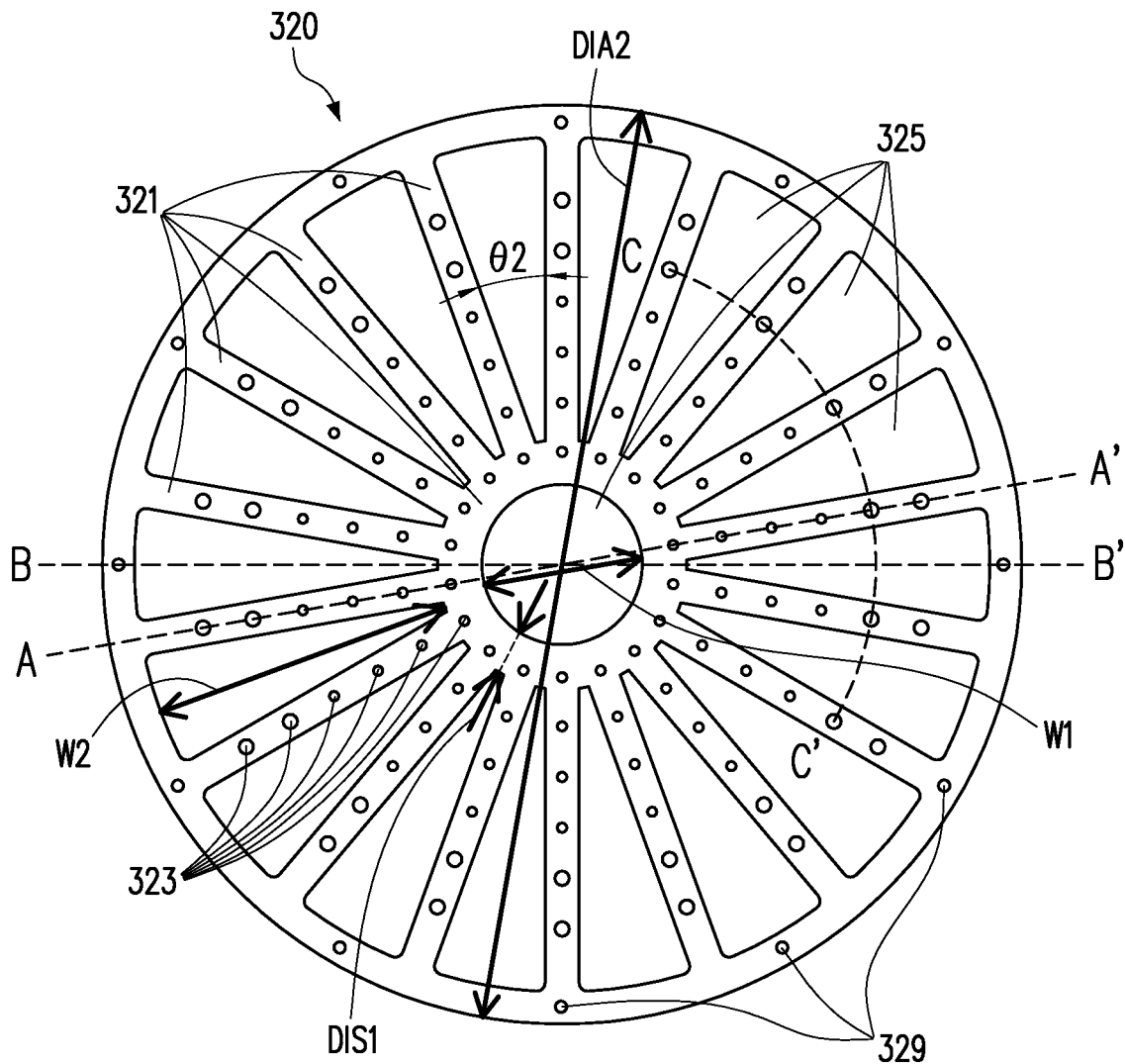
Figure 3D:
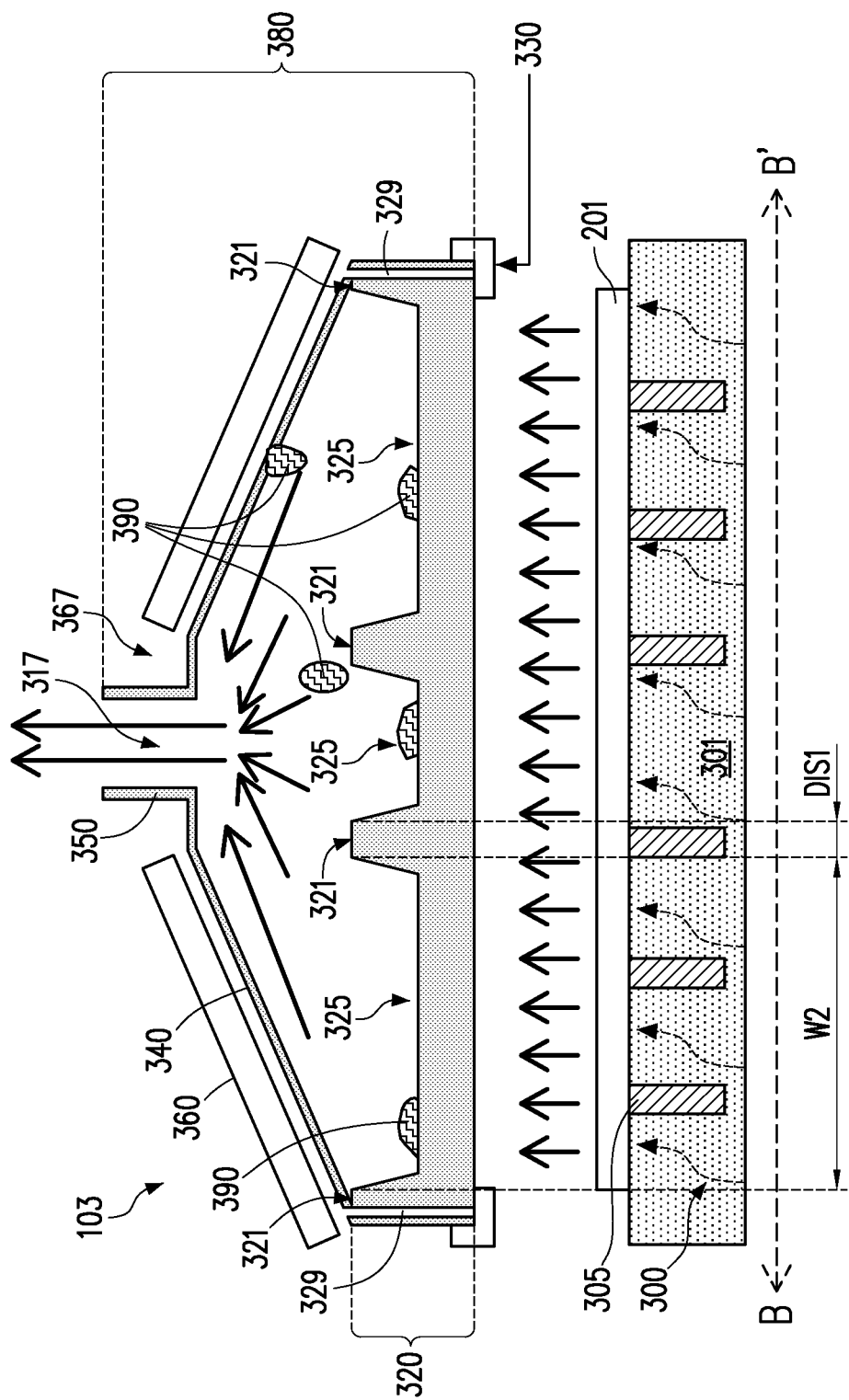
Figure 3E:
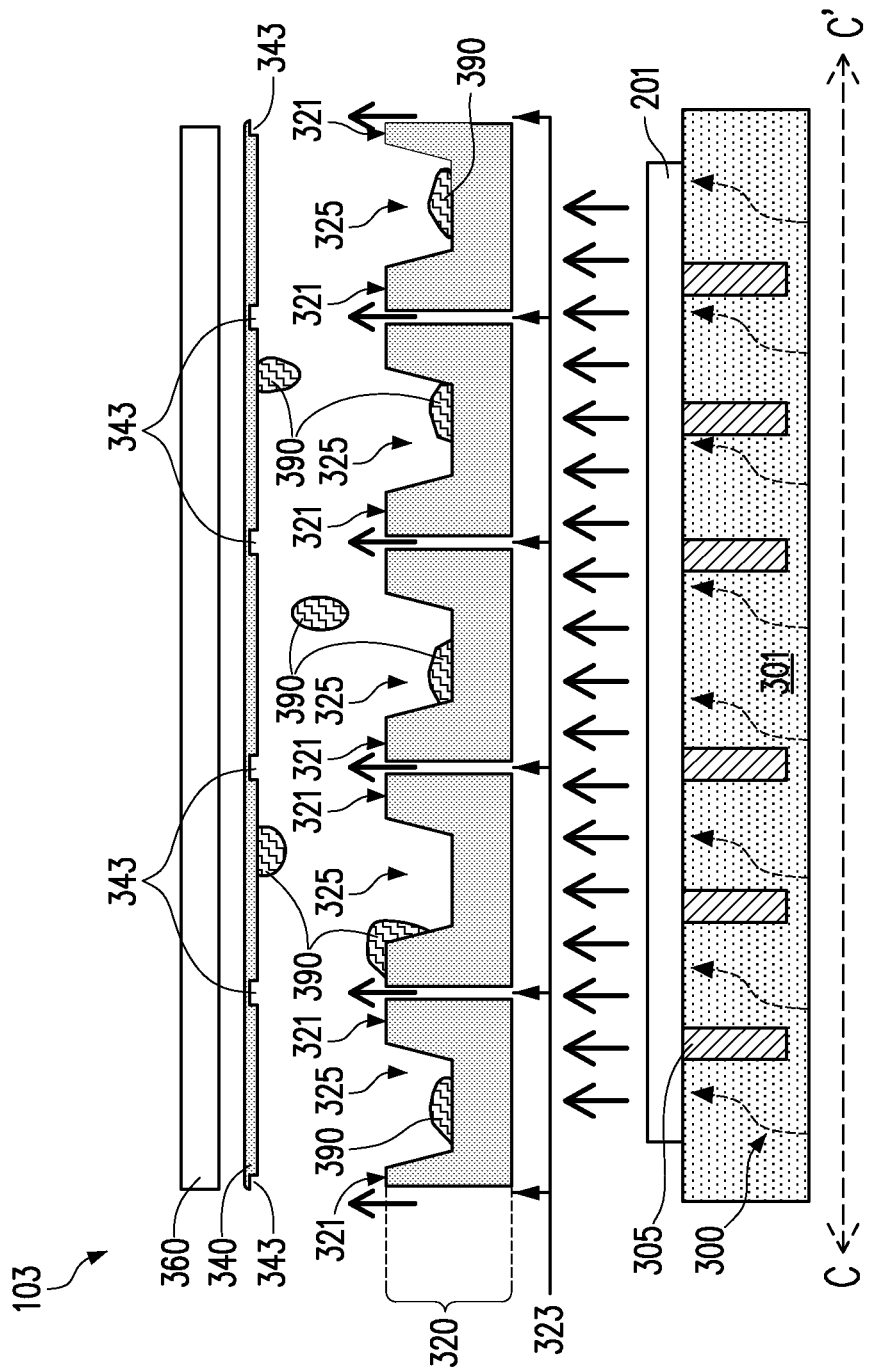
Figure 3F:
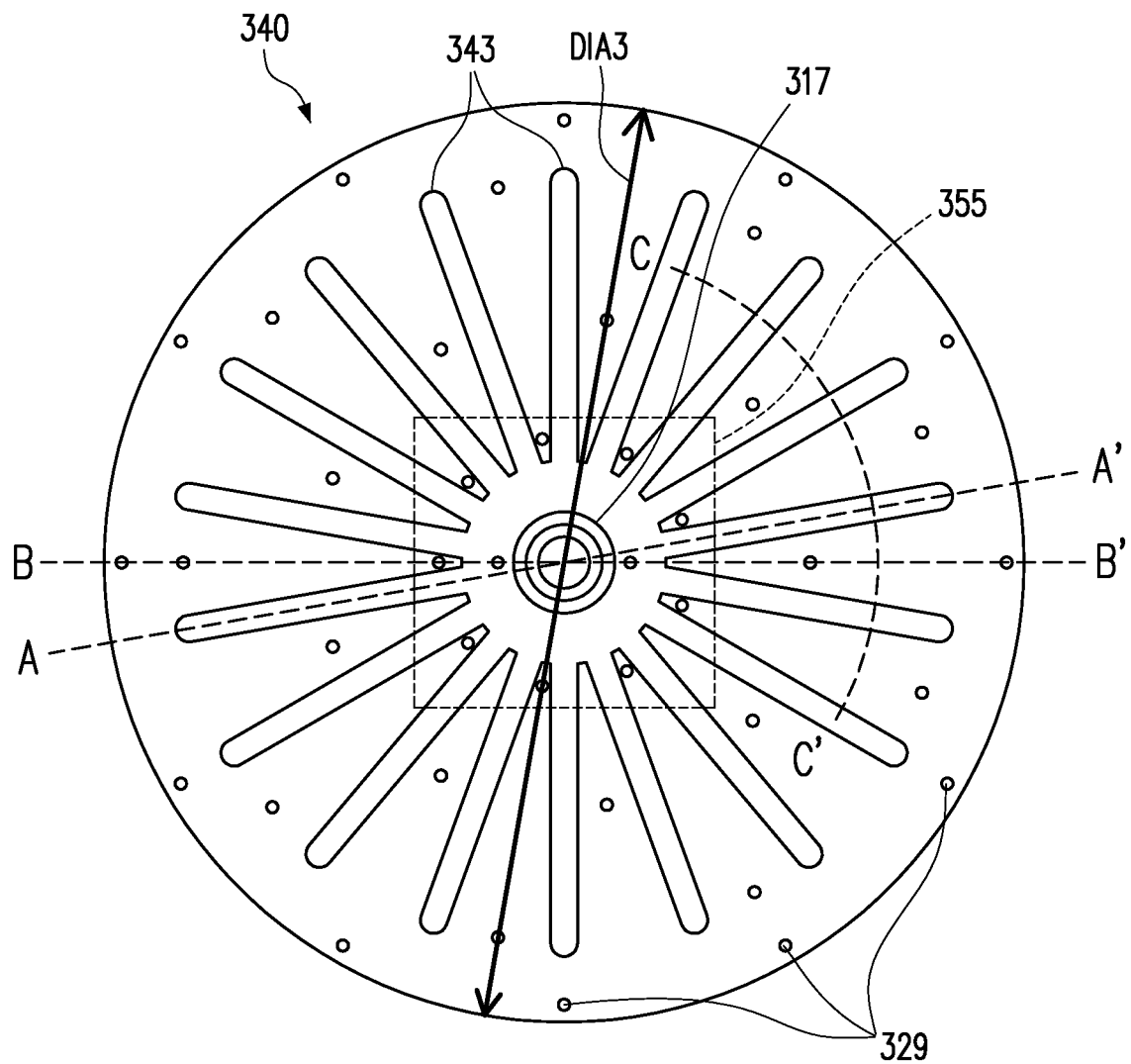
Figure 3G:
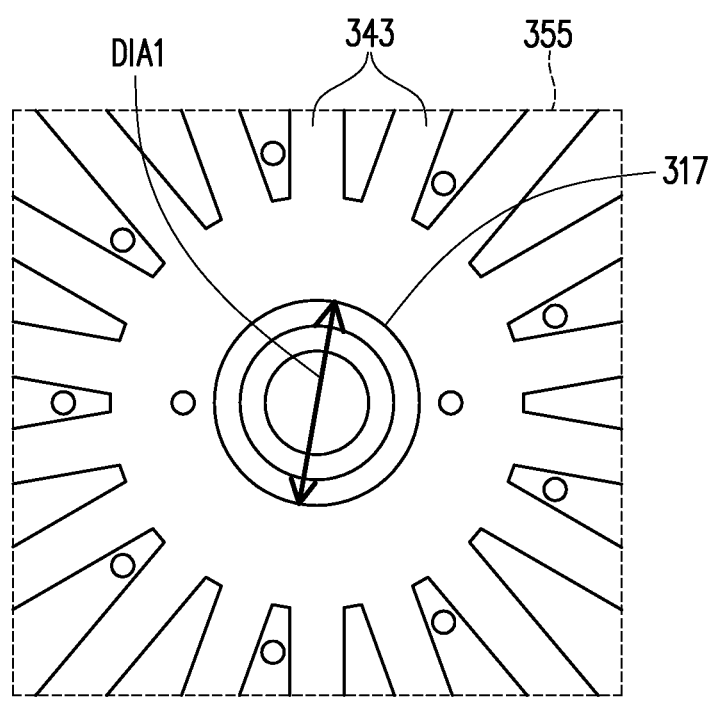
Figure 3H:
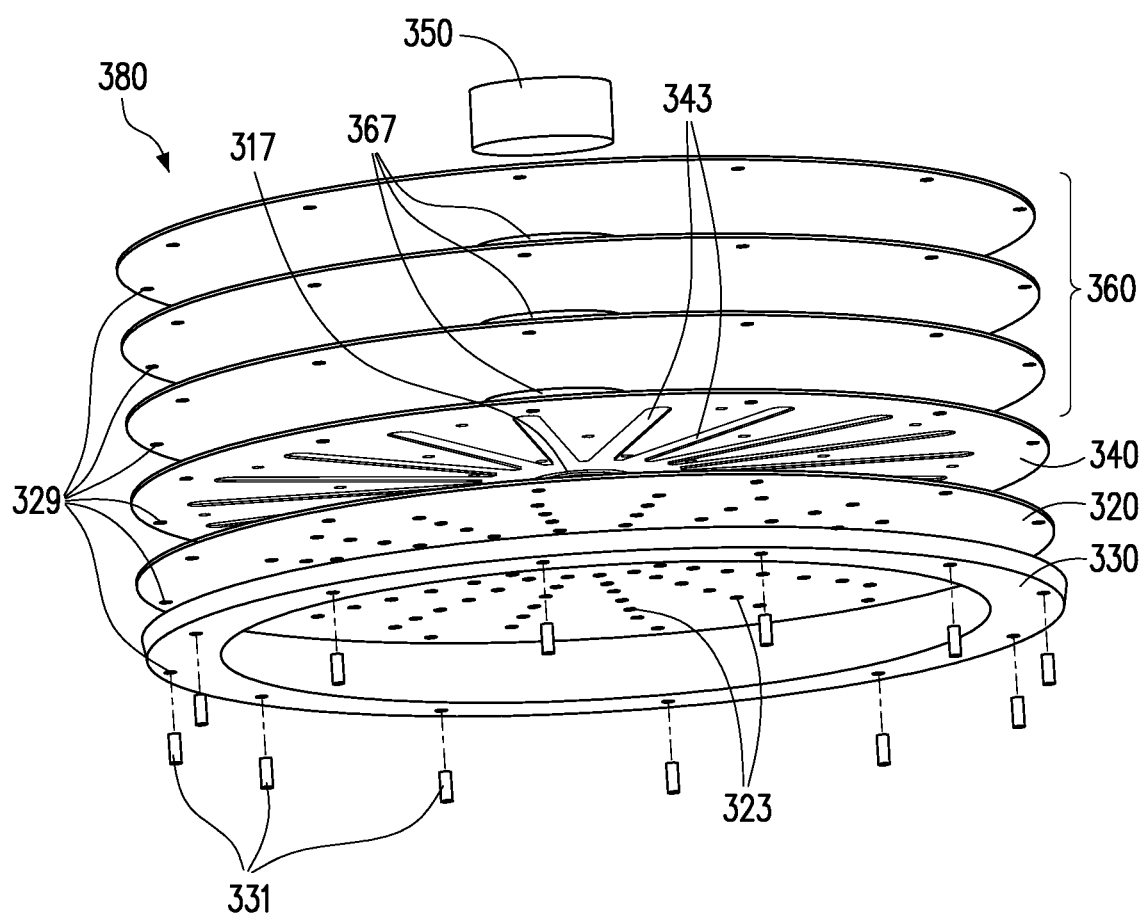

FIGS. 3A-3H illustrate various views of the pre-bake station 103 and various views of some components of the pre-bake station 103 with respect to different cut-lines, according to some embodiments. In particular, FIG. 3A illustrates a cross-sectional view of the pre-bake station 103 through a first cut-line A-A', FIG. 3B illustrates a top view of a hot plate 301 of the pre-bake station 103, and FIG. 3C illustrates a top view of a trench plate 320 (e.g., a first cover plate, a vented cover disk, or the like) of the pre-bake station 103, respectively. FIGS. 3D-3E illustrate cross-sectional views of the pre-bake station 103 through a second cut-line B-B' and through a third cut-line C-C', respectively. FIGS. 3F-3G illustrate a bottom view of a cover plate 340 (e.g., a second cover plate, an exhaust cover disk, or the like) of the pre-bake station 103 and a magnified view of a portion of the bottom view of the cover plate 340, respectively. FIG. 3H illustrates an exploded view of an exhaust hood assembly 380 of the pre-bake station 103.

FIG. 3A illustrates the pre-bake station 103 into which the substrate 201 with the photoresist 211 (not specifically illustrated in FIG. 3A) thereon, may be moved (through the transfer station 104) once the photoresist 211 has been applied to the substrate 201. According to some embodiments, the robotic arm of the transfer station 104 places the substrate 201 on the hot plate 301 of the pre-bake station 103 in preparation for further processing. The hot plate 301 raises the temperature of the substrate 201 and photoresist 211 in order to cure and dry the photoresist 211 prior to exposure to finish the application of the photoresist 211.

The pre-bake station 103 may be connected, for example, to intake pipes (not shown) in order to introduce air into the pre-bake station 103. The pre-bake station 103 may also be connected, for example, to one or more exhaust pipes (not shown) and one or more dampers (not shown) to assist in the evacuation and to vary a flow rate of volatile by-products of the pre-bake process 300, such as components of the evaporated solvent (illustrated by the directional arrows in FIG. 3A), from the pre-bake station 103.

The curing and drying of the photoresist 211 removes the solvent components while leaving behind the polymer resin, the PACs, cross-linking agents, and other chosen additives. In an embodiment, a pre-bake process 300 may be performed at a temperature suitable to evaporate the solvent(s), such as between about 40° C. and 150° C., although the precise temperature depends at least in part upon the materials chosen for the photoresist 211. The pre-bake process 300 is performed for a time sufficient to cure and dry the photoresist 211, such as between about 10 seconds to about 10 minutes, such as about 90 seconds. As the solvent evaporates during the pre-bake process 300, the vapor of the evaporated solvent rises (as illustrated in FIG. 3A by the directional arrows) and ultimately escapes through the trench plate 320 and through the exhaust hood assembly 380.

However, as the vapors of the evaporated solvent rise, there is a possibility that the vapors will cool down so much that the vapors will condense before the vapors exhaust from the pre-bake station 103. In some cases, these condensed vapors, now becoming liquid again, can either drop onto the wafer currently being processed, drop onto the next semiconductor wafer in the process, or else interfere with the exhaust flow. By falling back down to the substrate 201 (or subsequent substrates), the condensed liquid can interfere with the desired evaporation and drying process. Such interference can interfere with subsequent processes, thereby causing undesired defects within the manufactured device(s).

To help alleviate or prevent these defects, the exhaust hood assembly can be designed to both minimize the amount of condensation and the undesired effects due to the condensation. In an embodiment, the exhaust hood assembly 380 secures and suspends the trench plate 320 over the substrate 201 during baking processes (e.g., the pre-bake process 300). According to some embodiments, the exhaust hood assembly 380 comprises a retaining ring 330, the trench plate 320, a cover plate 340, an exhaust pipe header 350, and an exhaust hood heater 360.

The retaining ring 330 secures the trench plate 320 to the cover plate 340. According to some embodiments, the trench plate 320 is secured by the retaining ring 330 to the cover plate 340 using fasteners (e.g., screws, threaded bolts, and the like). However, any suitable fasteners and/or any suitable way to secure the trench plate 320 between the retaining ring 330 and the cover plate 340 (e.g., clamping, snap-fitting, and the like) may also be used.

In an embodiment, the trench plate 320 comprises ridges 321, trenches 325 and vent holes 323. According to embodiments, the vent holes 323 are located in the ridges 321 and extend through the ridges 321 and the trench plate 320 from the top of the ridges 321 to the bottom surface of the trench plate 320 opposite the top surfaces of the ridges 321. In some embodiments, the bottom surface of the trench plate 320 is substantially planar (within the range of manufacturing deviation); however, any suitable shape may be used. During baking processes (e.g., the pre-bake process 300), as vapor forms and rises from the evaporated solvent, the vapor escapes through the vent holes 323 of the trench plate 320 and makes its way up towards the cover plate 340.

The cover plate 340 serves as a lid covering the trench plate 320 with inner sidewalls of the cover plate 340, forming a first angle θ1 with the upper surface of the trench plate 320. According to some embodiments, the first angle θ1 is between about 30° and about 90°, such as about 90°. However, any suitable angle may be used. The cover plate 340 further comprises grooves 343 and an opening 317. During baking processes (e.g., the pre-bake process 300), the inner sidewalls of the cover plate 340 and the grooves 343 located in the inner sidewalls of the cover plate 340 aid in directing the vapor escaping through vent holes 323 of the trench plate 320 to the opening 317 in the cover plate 340 where the exhaust pipe header 350 is attached. According to some embodiments, the opening 317 in the cover plate 340 comprises a first diameter DIA1 of between about 20 mm and about 40 mm, such as about 30 mm, and the exhaust pipe header 350 is sized to fit the opening 317 of the cover plate 340. However, any suitable dimensions may be used for the opening 317 of the cover plate 340 and the exhaust pipe header 350.

According to embodiments, the exhaust hood assembly 380 comprises a single pipe for the exhaust pipe header 350 attached to the opening 317 in the cover plate 340. The opening 317 and the exhaust pipe header 350 are of sufficient size to maintain a flow level and exhaust efficiency for evacuating vapor from the exhaust hood assembly 380 during bake processes. In an embodiment the flow level may be between about 20 Pa and about 500 Pa, such as about 300 Pa. However, any suitable flow level may be utilized.

In an embodiment the exhaust pipe header 350 may be integrally formed with the cover plate 340 or may be attached to the cover plate 340. According to some embodiments, the exhaust pipe header 350 comprises the same diameter or substantially the same diameter as the first diameter DIA1 and is between about 20 mm and about 40 mm, such as about 30 mm. However, any suitable diameter may be utilized.

The design of the cover plate 340 and the exhaust pipe header 350 with a large opening may further facilitate the exhaust flow, because the flow level may be maintained at a high level in order to remove the vapors from the exhaust hood assembly 380 as quickly as possible. With such a quick removal, it significantly reduces the time for the vapors to cool down before exhausted, thereby reducing the possibility of the vapors condensing. As such, with less condensation, fewer defects from condensing liquids can be achieved in the final manufactured product. In addition, due to the large opening, the condensed vapors at the pipe may not block the opening. For example, because the vapors escape rapidly through the single large opening of the exhaust pipe header 350, less vapor accumulates at the surface of the cover plate 340 as compared to a design having a plurality of exhaust headers with relatively small openings and a restrictive exhaust flow.

Additionally, in an effort to help increase the exhaust flow rate of the vapors out of the exhaust hood assembly before the vapors can condense, in some embodiments, the surfaces of the cover plate 340, the exhaust pipe header 350, and the trench plate 320 can be coated with a layer of nonstick coating to help reduce the friction and allow the vapors to flow faster out of the exhaust pipe header 350. In an embodiment. the nonstick coating may comprise a non-stick material with a low coefficient of friction as well as hydrophobic properties such as polytetrafluoroethylene (PTFE), fluorinated ethylene propylene (FEP), perfluoroalkoxy (PFA), other fluorocarbons, combinations of these, or the like. However, any suitable material may be utilized.

The low coefficient of friction and hydrophobic properties of the nonstick coating, during bake processes, help reduce the amount of solvent vapor that condenses and wets these surfaces when the chemical solvent vapor comes in contact the cover plate 340, the exhaust pipe header 350, and the trench plate 320. As such, the nonstick coating aids in the evacuation of the vapor through the vent holes 323 of the trench plate 320 and through the exhaust hood assembly 380, which provides greater exhaust efficiency during bake processes. During the baking process or even after the bake processes, and when the exhaust hood assembly 380 begins to cool down, the amount of a residue of the evaporated solvent that forms on these inner surfaces is minimized. As such, damages caused by residue falling onto the substrate 201 during processing or falling onto subsequently processed workpieces during subsequent bake processes are also minimized or are altogether eliminated.

FIG. 3A further illustrates the exhaust hood heater 360 being fixed to an outer surface of the cover plate 340. In some embodiments, the exhaust hood heater 360 may be a resistive heating element, and may comprise one or more layers of suitable resistive materials, such as mica, quartz, polyimide, silicone rubber, semiconductor heater materials, metallic alloys, ceramic materials, ceramic metals, a combination thereof, or the like. During bake processes (e.g., the pre-bake process 300), the exhaust hood heater 360 heats the cover plate 340 and the exhaust pipe header 350 to suitable temperatures in order to allow the evaporated solvent escape through the trench plate 320 as a vapor. According to some embodiments, the exhaust hood heater 360 heats the cover plate 340 and the exhaust pipe header 350 to a bake temperature of between about 40° C. and 150° C., although the precise temperature depends upon the thermal characteristics of the materials chosen for the photoresist 211. As such, during bake processes, the exhaust hood heater 360 further aids in the evacuation of the vapor from the exhaust hood assembly 380, which increases an exhaust efficiency of the pre-bake station 103 and further minimizes the amount of residue that forms from the evaporated solvent on the inner surfaces of the cover plate 340 and the exhaust pipe header 350.

FIG. 3A also illustrates trenches 325, which are utilized to further reduce the possibility of the condensed vapors (if any) from reaching the substrate 201. In an embodiment, the trenches 325 are utilized to help capture the condensed vapors therein (instead of simply letting the condensed vapors flow into the vent holes 323). In an embodiment, the trenches 325 comprise substantially (within the range of manufacturing deviation) flat bottoms and angled sidewalls. According to some embodiments, the trenches 325 have a first width W1 of between about 1 mm and about 60 mm, such as about 30 mm, a first depth D1 of between about 1 mm and about 20 mm, such as about 5 mm, and angled sidewalls having second angles θ2 of between about 45° and about 90°, such as about 90°. However, any suitable widths, any suitable depths and any suitable angles may be used for the trenches 325.

FIG. 3A further illustrates residue 390 from the evaporated solvent that forms on the inner surfaces of the cover plate 340 and the exhaust pipe header 350 either during the bake processes or after the bake processes are completed, and temperatures within the pre-bake station 103 begin to cool down. As the residue 390 condenses and falls towards the trench plate 320, the residue 390 is collected on the upper surfaces of the trench plate 320. With the trenches 325 separating the vent holes 323, any residue 390 that is condensed but not directly over the vent holes 323 will not flow into/through the vent holes 323; instead, it will be collected within the trenches 325 of the trench plate 320. As such, this prevents the residue 390 from flowing through the vent holes 323 dripping onto the substrate 201, and causing damage to the substrate 201.

FIG. 3B illustrates a top view of the hot plate 301, according to an embodiment. In some embodiments, heating elements 305 such as resistive heating elements may be located within the hot plate 301. The heating elements 305 raise the temperature of the hot plate 301 during the bake processes. FIG. 3B further illustrates the cutline A-A' through the hot plate 301 relative to the cut lines A-A' illustrated in FIGS. 3A and 3C.

With reference now to FIG. 3C, this figure illustrates a top view of the trench plate 320 in an embodiment. According to some embodiments, the trench plate 320 is integrally formed as a single structure with the trenches 325 being separated from one another by the ridges 321. According to some embodiments, the trench plate 320 (e.g., vented cover disk) is annular in shape (e.g., a circular plate, a disk, or the like) having a second diameter DIA2 of between about 180 mm and about 320 mm. However, any suitable shape and any suitable diameter may be used for the trench plate 320. According to some embodiments, the vent holes 323 are aligned radially along centerlines. In some embodiments, the vent holes 323 have the same size diameters. According to some embodiments, the diameters of the vent holes 323 are between about 1 mm and about 20 mm. However, any suitable diameters may be utilized.

In other embodiments, the vent holes 323 may have diameters of different sizes. For example, as illustrated in FIG. 3C, the diameters of vent holes 323 that are radially aligned may increase in size as they are located further distances from a center of the trench plate 320. For example, the diameters of the vent holes 323 may increase between about 10 mm and about 50 mm, such as about 30 mm at each step away from the center. However, any suitable increase or decrease may be utilized.

FIG. 3C further illustrates that, according to some embodiments, through holes 329 are located along an outer edge of the trench plate 320 and extend through the trench plate 320. The trench plate 320 may have any suitable number (e.g., twelve) of through holes 329. In some embodiments, fasteners (e.g., screws, threaded bolts, and the like) are used to extend through the through holes 329 of the trench plate 320 to connect the retaining ring 330 to the cover plate 340 with the trench plate 320 secured there between. The through holes 329 may be any suitable type (e.g., threaded, non-threaded, lined, elongated slots, and the like), any suitable shape, and any suitable size of through holes.

FIG. 3C still further illustrates the first, second, and third cut-lines A-A', B-B' and C-C', respectively, which correlate to the cross-sectional views of the pre-bake station 103 in FIGS. 3A, 3D and 3E, respectively. The first cutline A-A' is taken through a centerline of an aligned series of the vent holes 323 in two of the ridges 321 extending radially in opposite directions from one another. The second cutline B-B' is taken through a centerline of three trenches 325 of the trench plate 320. One of the three trenches 325 is located in a center region of the trench plate 320 and separates the other two of the three trenches 325, and the other two of the three trenches 325 extend radially in opposite directions from one another. The third cutline C-C' is annularly shaped taken through a centerline of six of the vent holes 323 of six different ones of the ridges 321 separated by five different ones of the trenches 325 of the trench plate 320, the six of the vent holes 323 being disposed a same radial distance from the center of the trench plate 320.

According to some embodiments, the trenches 325 comprise a plurality of outer trenches extending from an outer portion of the trench plate 320 towards an inner portion of the trench plate 320 and radially surrounding a center trench disposed at a center of the trench plate 320. According to some embodiments, the center trench may have a first width W1 of between about 1 mm and about 60 mm, such as about 30 mm and the outer trenches may have a second width W2 of between about 10 mm and about 60 mm, such as about 50 mm. However, any suitable widths may be utilized. According to some embodiments, the outer trenches 325 may be separated from the inner trench 325 by a distance DIS1 of between about 1 mm and about 20 mm, such as about 5 mm. However, any suitable distances may be utilized.

FIG. 3D illustrates the cross-sectional view of the pre-bake station 103 through the second cutline B-B' including three of the trenches 325 and four of the ridges 321 being integrally formed within the trench plate 320. In the cross-sectional view of FIG. 3D, none of the vent holes 323 are shown, because the second cutline B-B' does not intersect any of the vent holes 323 which correlates to the second cutline B-B' illustrated in FIG. 3C. However, FIG. 3D does illustrate the through holes 329 located in the outer ring of the trench plate 320 because the second cutline B-B' intersects two of the through holes 329 which correlates to the second cutline B-B' illustrated in FIG. 3C.

FIG. 3E illustrates the cross-sectional view of the pre-bake station 103 through the annular shaped third cutline C-C' taken through six of the vent holes 323 located in six different ones of the ridges 321 separated by five different ones of the trenches 325 of the trench plate 320. In the cross-sectional view of FIG. 3E, the trench plate 320 appears to be separated from the cover plate 340 because the third cutline C-C' is taken through the pre-bake station 103 at points located at the same radial distance from the center of the pre-bake station 103. As such, the third cutline C-C' does not intersect any points along the outermost one of the ridges 321 of the trench plate 320 at which the cover plate 340 meets the trench plate 320 which correlates to the third cutline C-C' illustrated in FIG. 3C. Furthermore, in FIG. 3E, the cover plate 340 and the exhaust hood heater 360 do not appear to be angled at the first angle θ1 as illustrated in FIG. 3A, because the cross-section through the annular shape of the third cutline C-C' intersects points along the cover plate 340 and intersects points along the exhaust hood heater 360 at same respective distances above the substrate 201 which correlates to the third cutline C-C' illustrated in FIG. 3C.

FIGS. 3F-3G illustrate a bottom view of the cover plate 340 of the pre-bake station 103 and a magnified bottom view of the exhaust pipe header 350 of the cover plate 340, respectively. According to some embodiments, the cover plate 340 may have an outer dimension that is shaped and sized to match the outer dimension and shape of the trench plate 320. As such, the cover plate 340 fits over the trench plate 320 with outer edges of the cover plate 340 being aligned with the outer edges of the trench plate 320. In some embodiments, the cover plate 340 is annularly shaped with a third diameter DIA3 of between about 180 mm and about 320 mm. According to some embodiments, a surface of the cover plate 340 facing the trench plate 320, as illustrated in FIG. 3A, may have a slight concave shape with an acute angle for the first angle θ1. However, any suitable shapes, diameters, and angles may be used for the cover plate 340.

FIG. 3F further illustrates the cover plate 340 comprising the grooves 343 on the inner surface of the cover plate 340 facing the trench plate 320. In some embodiments, the grooves 343 form a radial pattern extending outward from an opening 317 through the cover plate 340 and the radial pattern of the grooves 343 is aligned with the radial pattern of the vent holes 323 of the trench plate 320. In such embodiments, each of the grooves 343 is aligned with respective ones of the vent holes 323 of the trench plate 320. In some embodiments, the grooves 343 may help guide evaporated vapors flowing from the vent holes 323 of the trench plate 320 to the opening 317 during baking processes (e.g., the pre-bake process 300). According to some embodiments, the opening 317 of the cover plate 340 has the first diameter DIM, as illustrated in the magnified bottom view of FIG. 3G. However, any suitable dimensions of the opening 317 through the cover plate 340 may be used.

FIG. 3H illustrates an exploded view of the components of the exhaust hood assembly 380 of the pre-bake station 103, according to some embodiments. The exhaust hood assembly 380 comprises fasteners 331 (e.g., threaded bolts), the retaining ring 330, the trench plate 320 over the retaining ring 330, the cover plate 340 over the trench plate 320, the exhaust hood heater 360 over the cover plate 340, and the exhaust pipe header 350 over the exhaust hood heater 360. In particular, FIG. 3H illustrates that the components of the exhaust hood assembly 380 are aligned such that through holes 329 of the components receive the fasteners 331 (e.g., threaded bolts) securing the components of the exhaust hood assembly 380 to one another. FIG. 3H further illustrates that the radial pattern of the grooves 343 in the cover plate 340 are aligned with the radial pattern of the vent holes 323 of the trench plate 320.

In some embodiments, the exhaust hood heater 360 comprises a stack of heating elements having an annular shape and a diameter substantially the same as the cover plate 340, the exhaust hood heater 360 conforming to an upper surface of the cover plate 340. The exhaust hood heater 360 comprises an opening 317 extending through the stack of heating elements at a center of the exhaust hood heater 360. In some embodiments, a vertical portion of the exhaust pipe header 350 extends through the opening 317 of the exhaust hood heater 360 and attaches to the opening 317 of the cover plate 340.

Figure 4:
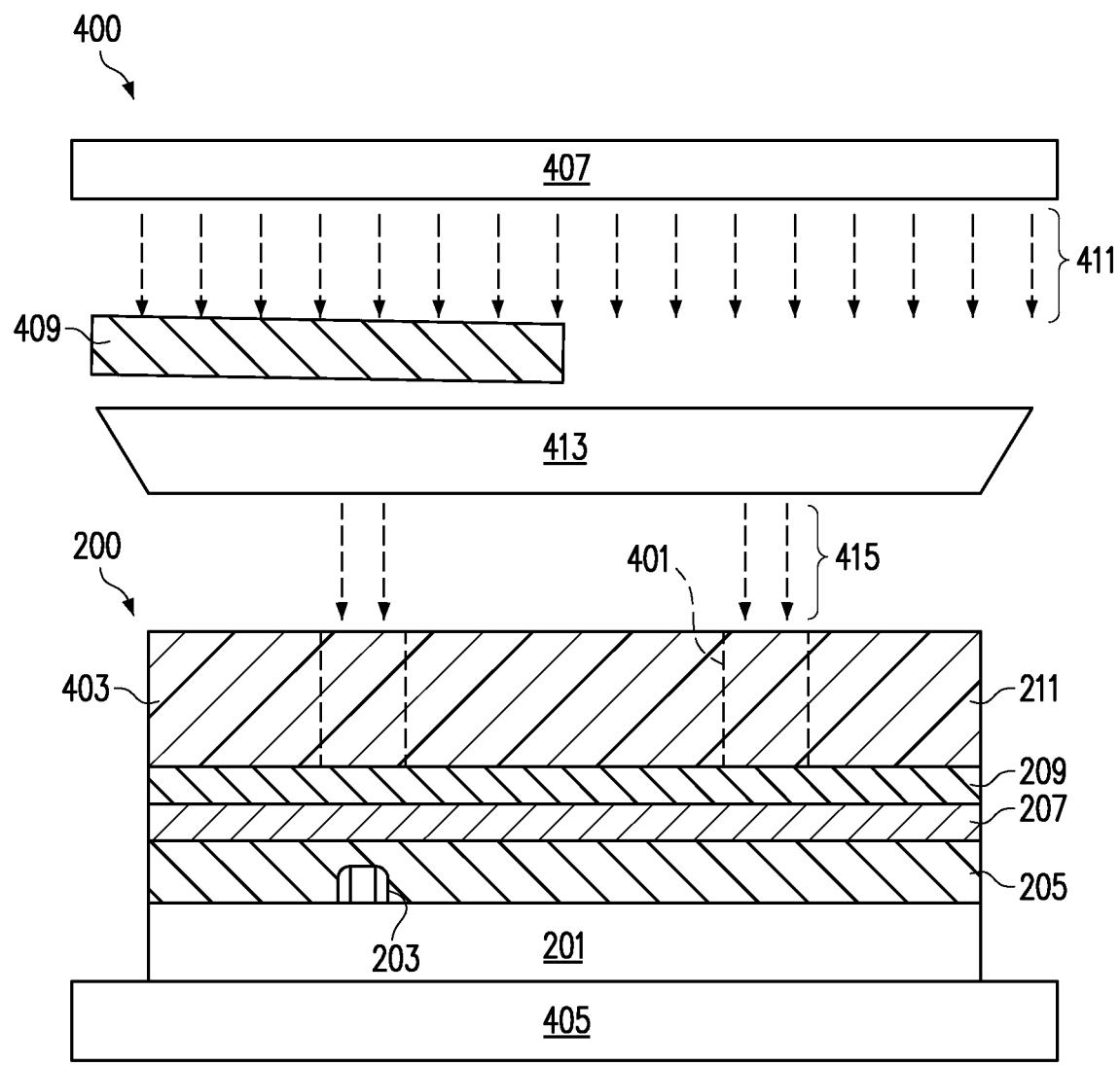
FIG. 4 illustrates an exposure process of the photoresist in accordance with an embodiment.

FIG. 4 illustrates an embodiment of an imaging device 400 of the exposure station 105 into which the substrate 201 and the photoresist 211 may be transferred (e.g., by a transfer station 104) after the curing and drying of the photoresist 211 in the pre-bake station 103. The exposure station 105 will expose the photoresist 211 to form one or more exposed regions 401 and one or more unexposed regions 403 within the photoresist 211. In an embodiment the exposure may be initiated by placing the semiconductor device 200 and the photoresist 211, once cured and dried, into the imaging device 400 for exposure. The imaging device 400 may comprise a support plate 405, an energy source 407, a patterned mask 409 arranged between the support plate 405 and the energy source 407, and optics 413. In an embodiment the support plate 405 is a surface to which the semiconductor device 200 and the photoresist 211 may be placed or attached to and which provides support and control to the substrate 201 during exposure of the photoresist 211. Additionally, the support plate 405 may be movable along one or more axes, as well as providing any desired heating or cooling to the substrate 201 and photoresist 211 in order to prevent temperature gradients from affecting the exposure process.

In an embodiment the energy source 407 supplies energy 411 such as light to the photoresist 211 in order to induce a reaction of the PACs, which in turn reacts with the polymer resin to chemically alter those portions of the photoresist 211 to which the energy 411 impinges. In an embodiment the energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 407 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 411, such as mercury vapor lamps, xenon lamps, carbon arc lamps or the like, may also be utilized.

The patterned mask 409 is located between the energy source 407 and the photoresist 211 in order to block portions of the energy 411 to form a patterned energy 415 prior to the energy 411 actually impinging upon the photoresist 211. In an embodiment the patterned mask 409 may comprise a series of layers (e.g., substrate, absorbance layers, anti-reflective coating layers, shielding layers, etc.) to reflect, absorb, or otherwise block portions of the energy 411 from reaching those portions of the photoresist 211 which are not desired to be illuminated. The desired pattern may be formed in the patterned mask 409 by forming openings through the patterned mask 409 in the desired shape of illumination.

Optics 413 may be used to concentrate, expand, reflect, or otherwise control the energy 411 as it leaves the energy source 407, is patterned by the patterned mask 409, and is directed towards the photoresist 211. In an embodiment the optics 413 comprise one or more lenses, mirrors, filters, combinations of these, or the like to control the energy 411 along its path. Additionally, while the optics 413 are illustrated in FIG. 4 as being between the patterned mask 409 and the photoresist 211, elements of the optics 413 (e.g., individual lenses, mirrors, etc.) may also be located at any location between the energy source 407 (where the energy 411 is generated) and the photoresist 211.

In an embodiment the semiconductor device 200 with the photoresist 211 is placed on the support plate 405. Once the pattern has been aligned to the semiconductor device 200, the energy source 407 generates the desired energy 411 (e.g., light) which passes through the patterned mask 409 and the optics 413 on its way to the photoresist 211. The patterned energy 415 impinging upon portions of the photoresist 211 induces a reaction of the PACs within the photoresist 211. The chemical reaction products of the PACs' absorption of the patterned energy 415 (e.g., acids/bases/free radicals) then reacts with the polymer resin, chemically altering the photoresist 211 in those portions that were illuminated through the patterned mask 409.

In a specific example in which the patterned energy 415 is a 193 nm wavelength of light, the PAC is a photoacid generator, and the polymer resin comprises a group to be decomposed which is a carboxylic acid group on the hydrocarbon structure and a cross linking agent is used, the patterned energy 415 will impinge upon the photoacid generator and the photoacid generator will absorb the impinging patterned energy 415. This absorption initiates the photoacid generator to generate a proton (e.g., an H+ atom) within the photoresist 211. When the proton impacts the carboxylic acid group on the hydrocarbon structure, the proton will react with the carboxylic acid group, chemically altering the carboxylic acid group and altering the properties of the polymer resin in general. The carboxylic acid group will then react with the cross-linking agent to cross-link with other polymer resins within the photoresist 211.

Optionally, the exposure of the photoresist 211 may occur using an immersion lithography technique. In such a technique an immersion medium (not individually illustrated in FIG. 4) may be placed between the imaging device 400 (and particularly between a final lens of the optics 413) and the photoresist 211. With this immersion medium in place, the photoresist 211 may be patterned with the patterned energy 415 passing through the immersion medium.

In this embodiment, a protective layer (also not individually illustrated in FIG. 4) may be formed over the photoresist 211 in order to prevent the immersion medium from coming into direct contact with the photoresist 211 and leaching or otherwise adversely affecting the photoresist 211. In an embodiment the protective layer is insoluble within the immersion medium such that the immersion medium will not dissolve it and is immiscible in the photoresist 211 such that the protective layer will not adversely affect the photoresist 211. Additionally, the protective layer is transparent so that the patterned energy 415 may pass through the protective layer without hindrance.

In an embodiment the protective layer comprises a protective layer resin within a protective layer solvent which should be removed. The material used for the protective layer solvent is, at least in part, dependent upon the components chosen for the photoresist 211, as the protective layer solvent should not dissolve the materials of the photoresist 211 so as to avoid degradation of the photoresist 211 during application and use of the protective layer. In an embodiment the protective layer solvent includes alcohol solvents, fluorinated solvents, and hydrocarbon solvents.

The protective layer resin may, similar to the photoresist 211, comprise a polymer with a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. However, any suitable protective layer resin may also be utilized.

Prior to application of the protective layer onto the photoresist 211, the protective layer resin and any other desired additives are first added to the protective layer solvent to form a protective layer composition. The protective layer solvent is then mixed to ensure that the protective layer composition has a consistent concentration throughout the protective layer composition.

Once the protective layer composition is ready for application, the substrate 201 with the photoresist 211 may be returned to the coating station 101 or may be transferred to another suitable station by the transfer station 104 for application of the protective layer composition over the photoresist 211. In an embodiment the application of the protective layer composition may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 211 of about 100 nm.

After the protective layer composition has been applied to the photoresist 211, a protective layer pre-bake may be performed in order to remove the protective layer solvent. As such, the transfer station 104 may return the semiconductor device 200 with the protective layer over the photoresist 211 to the pre-bake station 103 to perform the protective layer pre-bake before further processing. In an embodiment, the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer pre-bake has been performed, the semiconductor device 200 with the photoresist 211 and the protective layer are transferred from the pre-bake station 103 and placed on the support plate 405 of the exposure station 105, and the immersion medium may be placed between the protective layer and the optics 413. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may also be utilized.

The placement of the immersion medium between the protective layer and the optics 413 may be done using, e.g., an air knife configuration of the exposure station 105, whereby fresh immersion medium is applied to a region between the protective layer and the optics 413 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife configuration for the exposure station 105 described above is not the only configuration which may be used to expose the photoresist 211 using an immersion method. Any other suitable configuration using an immersion medium, such as immersing the entirety of the substrate 201 along with the photoresist 211 and the protective layer or using solid barriers instead of gaseous barriers may also be utilized. Any suitable method for exposing the photoresist 211 through the immersion medium may be used, and all are fully intended to be included within the scope of the embodiments.

Figure 5:
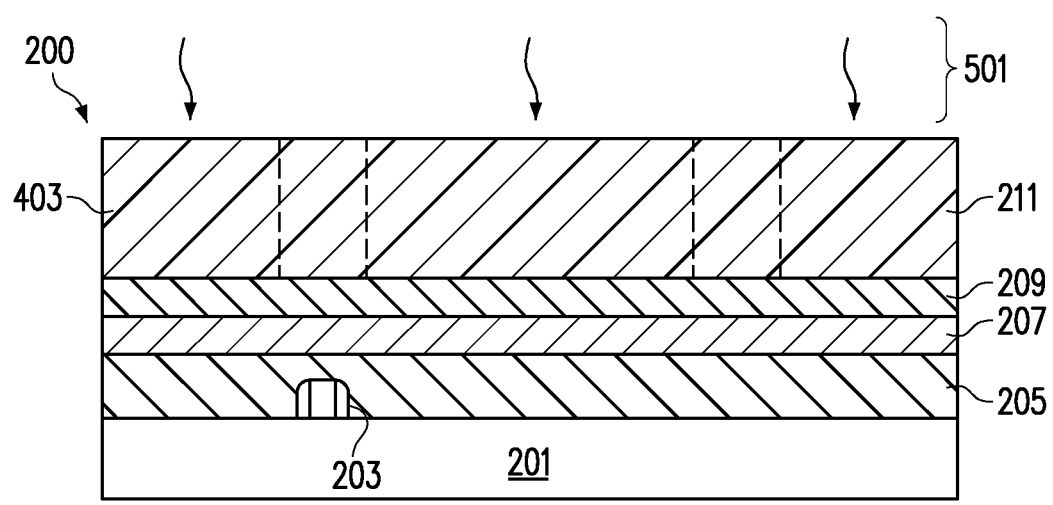
FIG. 5 illustrates a post-exposure baking process in accordance with an embodiment.

FIG. 5 illustrates a post-bake process of the semiconductor device, after the photoresist 211 has been exposed to the patterned energy 415 in the exposure station 105. The semiconductor device 200 with the photoresist 211 may be moved via the transfer station 104 from the exposure station 105 to the post-bake station 107. In some embodiments, the post-bake station 107 may be separate from but similar to the pre-bake station 103 illustrated in FIG. 3A. In other embodiments, the transfer station 104 may transfer the semiconductor device 200 with the photoresist 211 from the exposure station 105 to the pre-bake station 103 to perform the post-bake process. However, any suitable type of heating station such as a furnace or steam-heating station may also be utilized.

Once in the post-bake station 107, a first post-exposure bake (PEB) (e.g., PEB 501 represented in FIG. 5 by the wavy lines) may be used in order to assist in the generating, dispersing, and reacting of the acid/base/free radical generated from the impingement of the energy 411 upon the PACs during the exposure in the exposure station 105. Such assistance helps to create or enhance chemical reactions which generate chemical differences and different polarities between the one or more exposed regions 401 and the one or more unexposed regions 403 within the photoresist 211. These chemical differences also cause differences in the solubility between the one or more exposed regions 401 and the one or more unexposed regions 403. In an embodiment the semiconductor device 200 with the photoresist 211 may be placed on the hot plate 301 and the temperature of the photoresist 211 may be increased to between about 50° C. and about 160° C. for a period of between about 40 seconds and about 120 seconds.

Returning now to FIG. 1, the photoresist track system 100 comprises a developer station 109 which can be used, if desired, to develop the photoresist 211 with a positive tone developer or a negative tone developer and which comprises equipment and chemicals which are specific to the development process. In an embodiment the developer station 109 may be connected to the post-bake station 107 through, e.g., the transfer station 104 so that the semiconductor device 200 and photoresist 211 may be transferred to the developer station 109 shortly after the PEB 501 without breaking the interior environment of the photoresist track system 100.

Figure 6A:
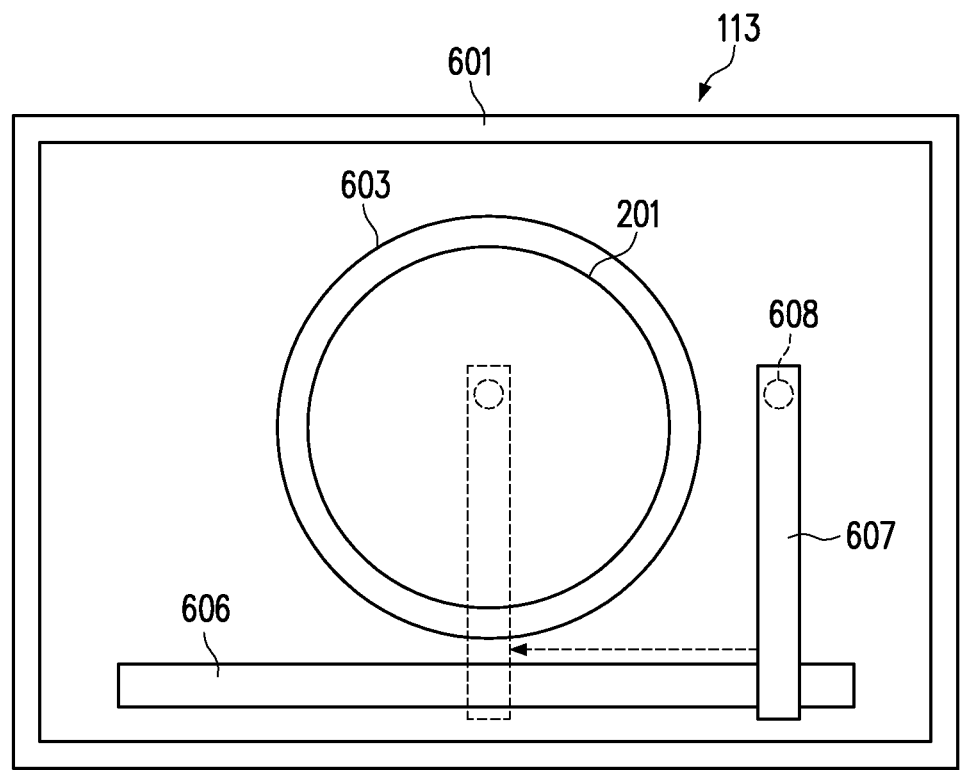
FIGS. 6A-6C illustrate a development process of the photoresist in accordance with an embodiment.
Figure 6B:
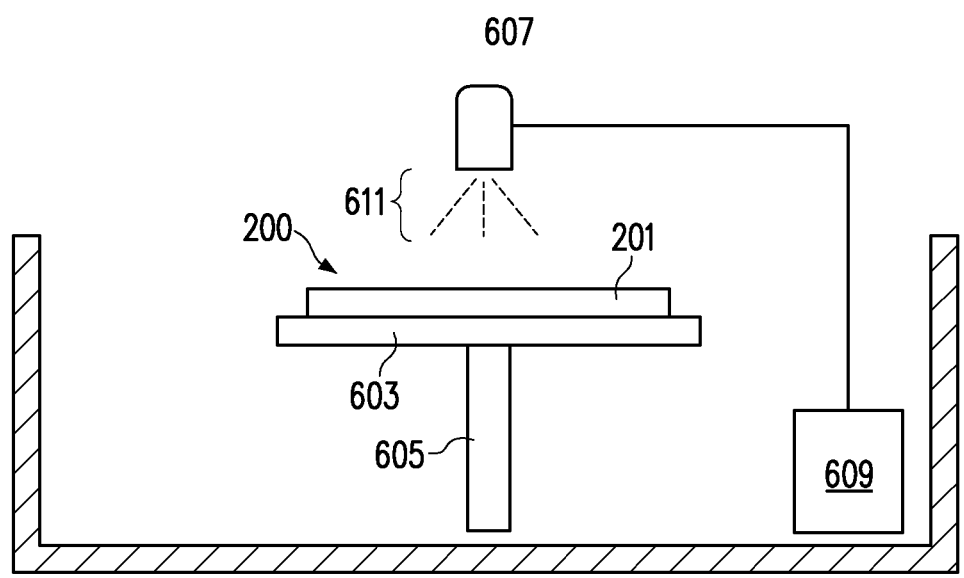

FIGS. 6A-6B illustrate a top view and a representative cross-sectional view of an embodiment of the developer station 109 in which the developer station 109 uses a spin-on method to apply the developer. In an embodiment the developer station 109 comprises a rotating developer chuck 603 attached to a rotating spindle 605. A developer dispensing arm 607 with a developer nozzle 608 (on a developer track 606) is operably connected to a developer storage tank 609 so that the developer storage tank 609 provides a fresh supply of the developer 611 to the developer dispensing arm 607.

In an embodiment the substrate 201 is placed onto the rotating developer chuck 603 and is held in place using, e.g., a vacuum pressure suctioning the substrate 201 to the rotating developer chuck 603. The rotating spindle 605 is attached to the rotating developer chuck 603 and is engaged, thereby rotating the rotating developer chuck 603, the substrate 201 with the photoresist 211, at a speed of between about 500 rpm and about 3500 rpm. Once the photoresist 211 is rotating at the desired speed, the developer dispensing arm 607 moves over the rotating photoresist 211 and begins to dispense the developer 611 out of the developer nozzle 608 and onto the photoresist 211 at a rate of between about 0.5 cc/sec and about 20 cc/sec, at a temperature of between about 10° C. and about 50° C., such as about 50° C., for a period of time between about 10 second and about 60 minutes, such as about 30 minutes.

In an embodiment the developer dispensing arm 607 dispenses a developer 611 (e.g., a negative tone developer), such as an organic solvent or critical fluid to remove those portions of the photoresist 211 which were not exposed to the energy 411 during the exposure process and, as such, retain their original solubility. Specific examples of materials that may be utilized include hydrocarbon solvents, alcohol solvents, ether solvents, ester solvents, critical fluids, combinations of these, or the like.

In an embodiment in which immersion lithography is utilized to expose the photoresist 211 and the protective layer utilized to protect the photoresist 211 from the immersion medium, the developer 611 may be chosen to remove not only those portions of the photoresist 211 that are desired to be removed, but may also be chosen to remove the protective layer in the same development step. Also, the protective layer may be removed in a separate process, such as by a separate solvent from the developer 611 or even an etching process to remove the protective layer from the photoresist 211 prior to development.

However, while the spin-on method and configuration described herein for the developer station 109 is one suitable method for developing the photoresist 211 in the developer station log, it is intended to be illustrative and is not intended to limit the embodiment. Rather, the developer station 109 may comprise any mechanism and chemicals in any configuration for any type of development process, include a dip process configuration, a puddle process configuration, combinations of these, or the like. All such development processes and configuration for the developer station 109 are fully intended to be included within the scope of the embodiments.

Furthermore, in an embodiment all of the mechanics and other structures that make up the developer station 109 (e.g., the rotating developer chuck 603, the rotating spindle 605, the developer dispensing arm 607, etc.) are housed within an exterior housing 601, which provides support and protection to the internal components of the developer station 109. In an embodiment the exterior housing 601 encloses the developer station 109 and is accessible through the transfer station 104 of the photoresist track system 100. Additionally, any utilities, such as electricity or fresh raw materials (e.g., fresh developer or fresh rinse water), may come in, if desired, through the exterior housing 601.

Figure 6C:
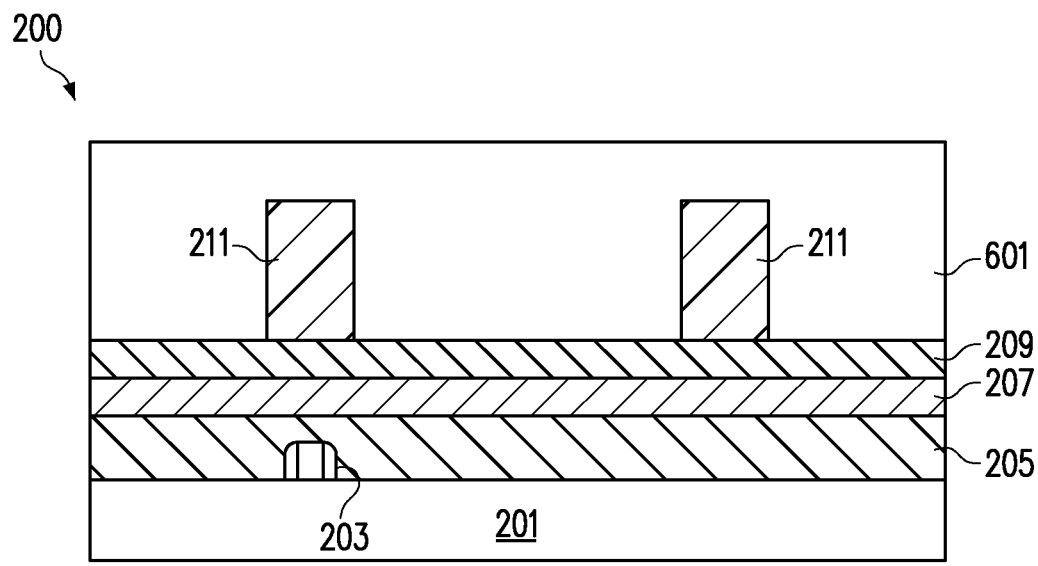

FIG. 6C illustrates a cross-sectional view of the application of the developer 611 onto the photoresist 211. In an embodiment the developer 611 will dissolve the unexposed regions 403 of the photoresist 211 that were not exposed to the patterned energy 415. This dissolving will leave behind the one or more exposed regions 401 of the photoresist 211 that had been exposed to the patterned energy 415, thereby transferring the pattern of the patterned energy 415 to the photoresist 211. Once finished, the developer 611 may be removed by stopping the dispensing of the developer 611 while keeping the substrate 201 spinning to remove the developer 611 and performing an optional rinse with, e.g., deionized water.

Returning now to FIG. 1, after the photoresist 211 has been developed in the developer station 109, the substrate 201 and the photoresist 211 may be transferred by the transfer station 104 into the optional hard bake station 111 for further processing. Once the substrate 201 and the photoresist 211 are in position, the optional hard bake station 111 may optionally be used to perform a hard-bake process to help polymerize and stabilize the photoresist 211 after the development process, and also aids in improving the adhesion of the photoresist 211 to the layer to be patterned 209. In some embodiments the optional hard bake station 111 may be separate from but similar to the pre-bake station 103 including the hot plate 301 (see, e.g., FIG. 3A) and exhaust hood assembly 380. In other embodiments, the transfer station 104 may transfer the substrate 201 from the developer station 109 to the pre-bake station 103 to perform the hard-bake process. However, any suitable type of heating station such as a furnace or steam-heating station may also be utilized.

Figure 7:
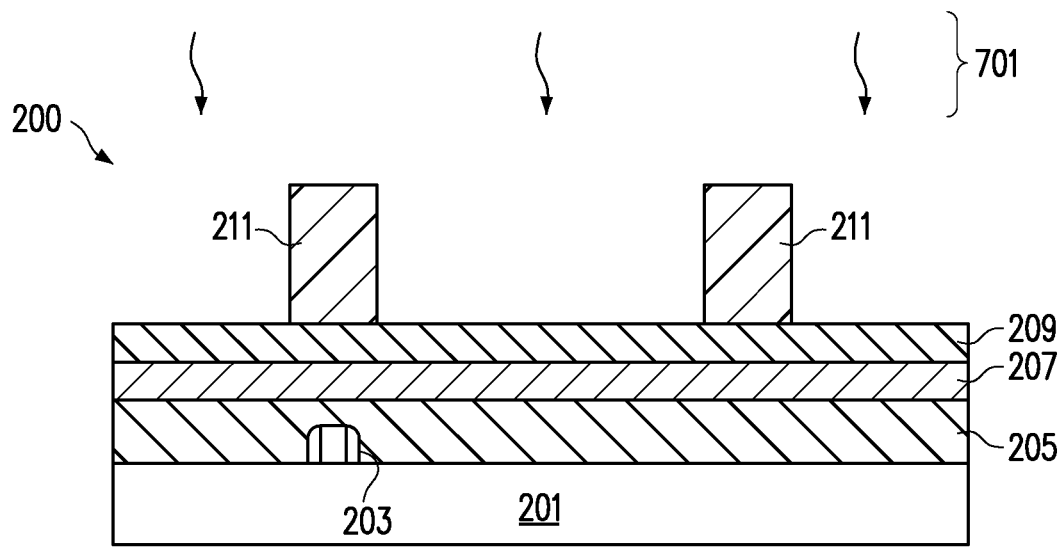
FIG. 7 illustrates a hard bake process in accordance with an embodiment.

Turning to FIG. 7, once the substrate with the photoresist 211 is in the optional hard bake station 111, a hard bake process 701 (represented in FIG. 7 by the wavy lines) may be performed on the substrate 201 with the photoresist 211. During the hard bake process 701, the hot plate 301 and the heating elements 305 are engaged to raise the temperature of the photoresist 211 to a process temperature of between about 70° C. to about 130° C. The photoresist may be kept at this process temperature for a time period of between about 1 minute and about 3 minutes.

Once the hard bake has been performed on the photoresist 211, and any other processes such as rinsing or drying that may be desired, the substrate 201 with the photoresist 211 is ready for further processing and may be removed from the photoresist track system 100 through the second loadlock chamber 114. Similar to the first loadlock chamber 102, the second loadlock chamber 114 allows the substrate 201 to be removed from the photoresist track system 100 without exposing the interior stations to the exterior atmosphere.

Figure 8A:
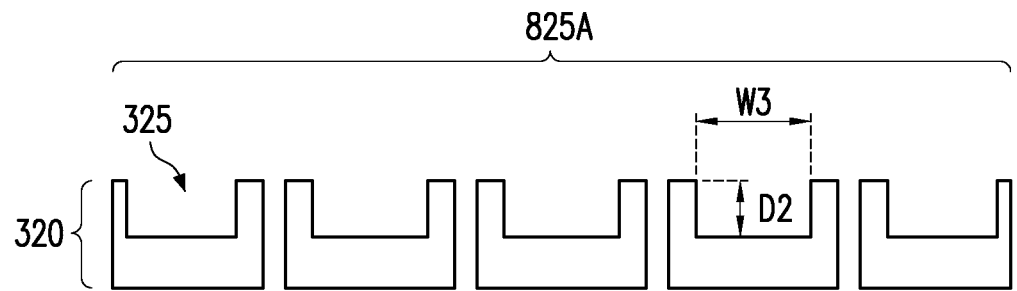
FIGS. 8A-8C illustrate cross-sectional views of the trench plate of FIG. 3C taken through the cut-line C-C' in accordance with some other embodiments.
Figure 8B:
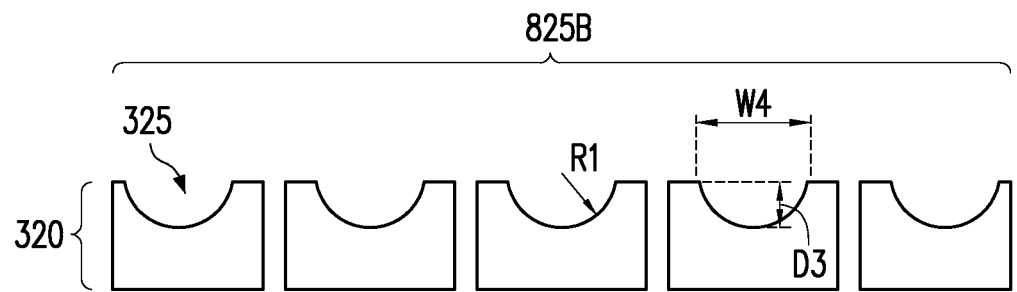
Figure 8C:
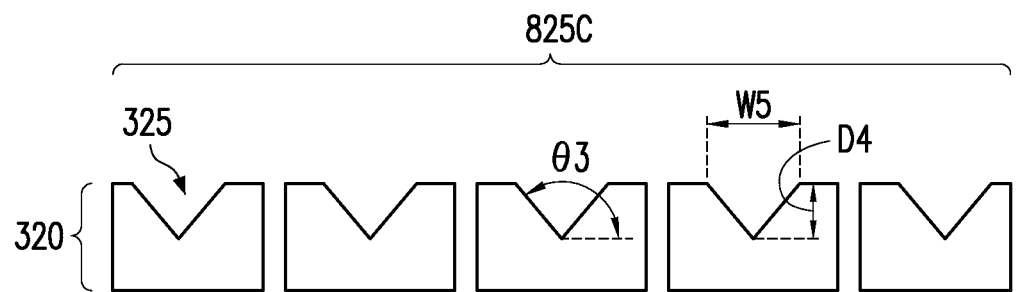

FIGS. 8A-8C illustrate cross-sectional views of several different profiles of the trench plate 320, according to some other embodiments. Although specific shapes and dimensions are illustrated in FIGS. 8A-8C for the different profiles of the trench plate 320, these shapes and dimensions are intended to be illustrative and are not intended to limit the embodiments.

FIG. 8A illustrates the trench plate 320 comprising a second profile 825A having trenches 325 with substantially (within the range of manufacturing deviation) flat bottoms and substantially (within the range of manufacturing deviation) vertical sidewalls. According to some embodiments, the second profile 825A comprises trenches 325 having a third width W3 of between about 1 mm and about 60 mm, such as about 30 mm and a second depth D2 of between about 1 mm and about 20 mm, such as about 5 mm. However, any suitable widths and any suitable depths may be used for the trenches 325 of the second profile 825A.

FIG. 8B illustrates the trench plate 320 comprising a third profile 825B having trenches 325 with rounded bottoms and rounded sidewalls. According to some embodiments, the third profile 825B comprises trenches 325 having a fourth width W4 of between about 1 mm and about 60 mm, such as about 30 mm, a third depth D3 of between about 1 mm and about 20 mm, such as about 5 mm, and having a first radius R1 of the rounded bottoms and rounded sidewalls of between about 1 mm and about 20 mm, such as about 5 mm. However, any suitable widths, any suitable depths, and any suitable radiuses may be used for the trenches 325 of the third profile 825B.

FIG. 8C illustrates the trench plate 320 comprising a fourth profile 825C having trenches 325 with pointed bottoms and angled sidewalls. According to some embodiments, the fourth profile 825C comprises trenches 325 having a fifth width W5 of between about 1 mm and about 60 mm, such as about 30 mm, a fourth depth D4 of between about 1 mm and about 20 mm, such as about 5 mm, and angled sidewalls having third angles θ3 of between about 120° and about 170°, such as about 135°. However, any suitable widths, any suitable depths and any suitable angles may be used for the trenches 325 of the fourth profile 825C.

Figure 9A:
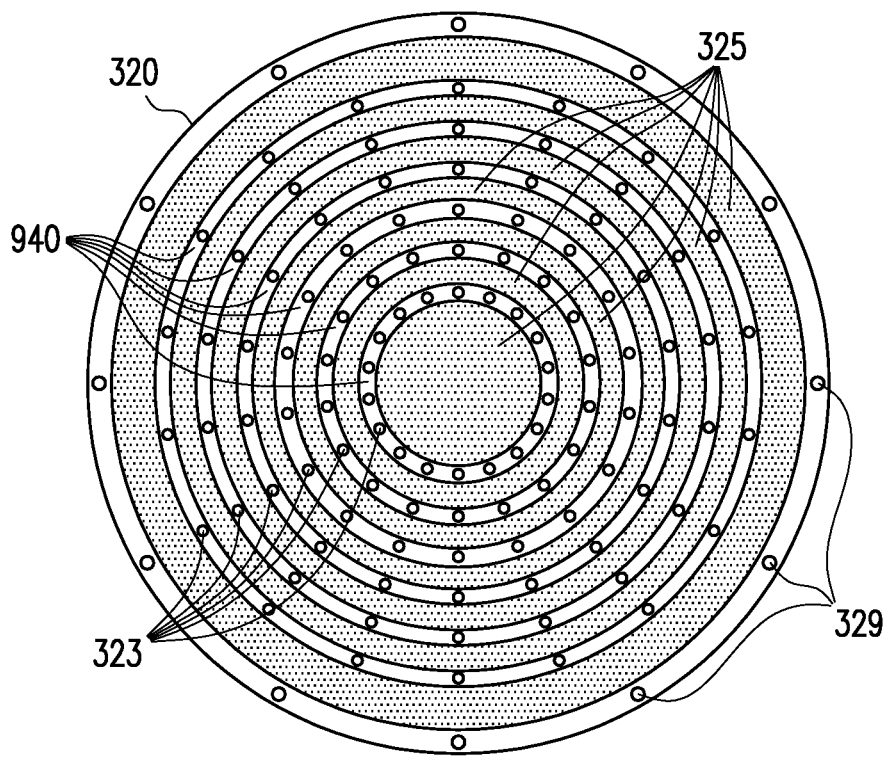
FIGS. 9A-9B illustrate top-down views of trench plates in accordance with still some other embodiments.
Figure 9B:
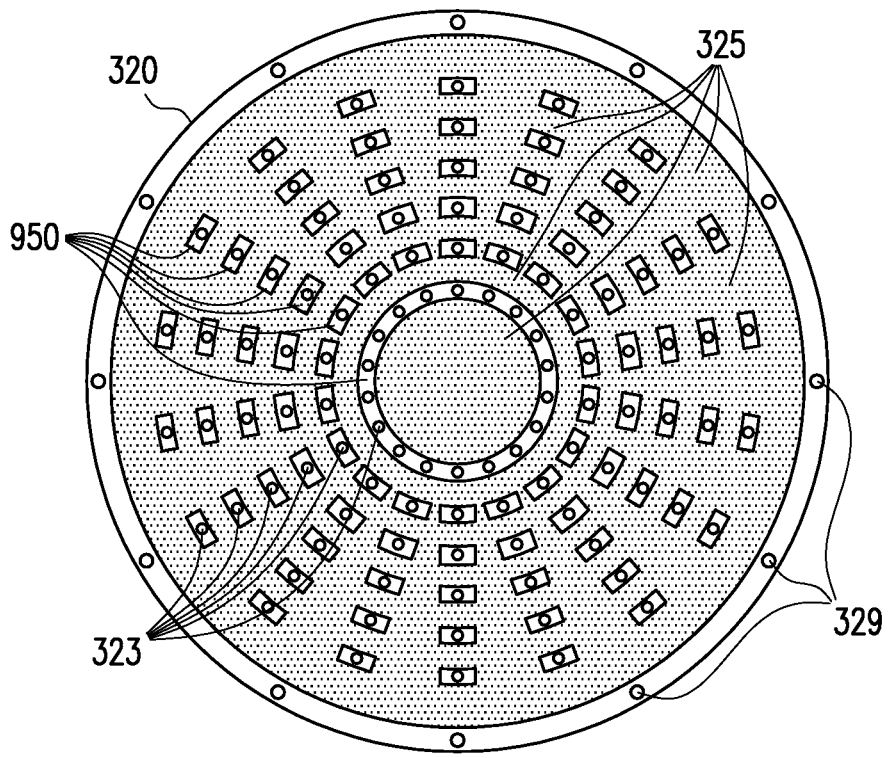

FIGS. 9A-9B illustrate top views of several different configurations of the trench plate 320, according to some embodiments different from the embodiment illustrated in FIG. 3C. Although specific shapes and dimensions are illustrated in FIGS. 9A-9B for the different configurations of the trench plate 320, these shapes and dimensions are intended to be illustrative and are not intended to limit the embodiments.

FIG. 9A illustrates the trench plate 320, according to another embodiment, comprising a series of raised concentric circles 940 instead of the ridges 321 of FIG. 3C and trenches 325 arranged alternately between the series of raised concentric circles 940. The series of raised concentric circles 940 comprise vent holes 323 arranged in a radial pattern across the series of raised concentric circles 940 and comprise through holes 329 arranged within an outermost ridge of the series of raised concentric circles 940. However, any suitable number of concentric circles and any suitable arrangement of vent holes 323 within the series of raised concentric circles 940 may be used.

FIG. 9B illustrates the trench plate 320, according to yet another embodiment, comprising a plurality of columns 950 instead of the ridges 321 of FIG. 3C. The plurality of columns 950 are disposed in a radial pattern with areas between columns forming a plurality of the trenches 325 that are integrally connected. The plurality of columns 950 comprise vent holes 323 arranged within the corresponding ones of the radial pattern of columns 950 and comprise through holes 329 arranged within an outermost circular ridge along a perimeter of the trench plate 320. However, any suitable number and any suitable shape of the plurality of columns 950 and any suitable arrangement of vent holes 323 within the ridges 321 may also be used.

While the different profiles and configurations of the trench plate 320 are illustrated in FIGS. 8A-8D and 9A-9B with specific shapes and specific dimensions suitable for the trench plate 320, these are intended to be illustrative and are not intended to limit the embodiments. Rather, the profiles and configurations of the trenches 325 of the trench plate 320 may comprise any suitable shapes, any suitable sizes, any suitable dimensions, and in any suitable configuration for collecting the residue 390 within the trenches 325 and preventing the residue from dripping onto the semiconductor device 200 during bake processes. All such profiles and configurations for the trenches 325 of the trench plate 320 are fully intended to be included within the scope of the embodiments.

By providing nonstick coatings on inner surfaces of the cover plate 340 and the exhaust pipe header 350 of the exhaust hood assembly 380, the solvent vapor condensing into the residue 390 is prevented or minimized from wetting the inner surfaces of the cover plate 340 and the exhaust pipe header 350 which aids in the evacuation of the chemical solvent vapor from the exhaust hood assembly 380 during baking processes. Furthermore, by collecting and trapping any residue 390 within trenches 325 of the trench plate 320, it is possible to prevent the residue 390 from dropping onto the substrate 201 and causing defects on the substrate 201.

As such, the exhaust hood assembly 380 efficiently evacuates solvent vapor during bake processes (e.g., the pre-bake process 300), minimizes the chemical solvent vapor from condensing into a residue and wetting inner surfaces of the exhaust hood assembly, and prevents any residue that has formed from dripping onto and causing damage to a wafer. As such, high exhaust efficiency, improved reliability, increased yield, and ultimately reduced manufacturing time and costs are achieved by the apparatus and bake process methods, as described herein.

In accordance with an embodiment, a semiconductor manufacturing apparatus includes: a trench plate comprising a first surface and a second surface opposite the first surface, wherein the trench plate comprises a first trench extending partially through the trench plate from the first surface, wherein the trench plate also comprises a first opening extending fully through the trench plate from the first surface to the second surface, and a second opening extending fully through the trench plate from the first surface to the second surface, the first trench being located between the first opening and the second opening. In accordance with an embodiment the first surface comprises polytetrafluoroethylene. In accordance with an embodiment the first trench is located within a center of the trench plate. In accordance with an embodiment the trench plate further comprises a second trench separated from the first trench by a first distance between about 1 mm and about 20 mm. In accordance with an embodiment the first trench has a width which increases in size as the first trench extends towards an outer perimeter of the trench plate. In accordance with an embodiment the first trench comprises angled sidewalls. In accordance with an embodiment the semiconductor manufacturing apparatus further includes attachment holes located along a perimeter of the trench plate.

In accordance with another embodiment, a semiconductor manufacturing apparatus includes: a trench plate, wherein the trench plate comprises ridges, a trench disposed between the ridges, and a vent hole extending through the ridges and from a first side of the trench plate to a second side of the trench plate; and a cover plate over and attached to the trench plate. In accordance with an embodiment, the semiconductor manufacturing apparatus further includes a single pipe header attached to the cover plate, wherein the single pipe header is the lone pipe header attached to the cover plate. In an embodiment the single pipe header has a diameter of between about 20 mm and about 40 mm. In an embodiment, surfaces of the trench plate and the cover plate comprise a polytetrafluoroethylene coating. In an embodiment the trench comprises angled sidewalls and a substantially flat bottom surface. In an embodiment the trench comprises a substantially flat bottom surface and sidewalls extending in a direction substantially vertical to the substantially flat bottom surface. In an embodiment the trench has a concave profile.

In accordance with yet another embodiment, a method includes: placing a semiconductor wafer with a material disposed thereon within a bake station; and heating the semiconductor wafer with the material disposed thereon, thereby forming an evaporated portion of the material, wherein a first portion of the evaporated portion passes through vent holes of a trench plate and through a cover plate above the trench plate, and wherein a second portion of the evaporated portion passes through the vent holes of the trench plate, condenses, and enters trenches within the trench plate after condensing. In an embodiment the trench plate comprises polytetrafluoroethylene. In an embodiment all of the evaporated portion that does not condense passes through a single opening in the cover plate. In an embodiment the single opening has a diameter of between about 20 mm and about 30 mm. In an embodiment the material is a photoresist. In an embodiment the cover plate has a second trench and the first portion of the evaporated portion enters the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing apparatus comprising:
a hot plate with a semiconductor wafer holding region;
at least one heater within the hot plate;
a trench plate over the hot plate, wherein the trench plate comprises a first trench extending partially through the trench plate from a first surface, wherein the trench plate also comprises a first opening extending fully through the trench plate from the first surface to a second surface, and a second opening extending fully through the trench plate from the first surface to the second surface, the first trench being located between the first opening and the second opening; and
a cover plate over the trench plate, wherein the cover plate and the trench plate at least partially enclose a first region, and wherein an exhaust opening extends through the cover plate to the first region.

2. The semiconductor manufacturing apparatus of claim 1, wherein the trench plate comprises polytetrafluoroethylene.

3. The semiconductor manufacturing apparatus of claim 1, wherein the cover plate has a single opening over the trench plate.

4. The semiconductor manufacturing apparatus of claim 3, wherein the single opening has a diameter of between about 20 mm and about 30 mm.

5. The semiconductor manufacturing apparatus of claim 3, further comprising:
a semiconductor wafer on the semiconductor wafer holding region; and
a photoresist overlying the semiconductor wafer.

6. The semiconductor manufacturing apparatus of claim 3, further comprising a single pipe header attached to the single opening in the cover plate, wherein the single pipe header is the lone pipe header attached to the cover plate.

7. The semiconductor manufacturing apparatus of claim 1, wherein the cover plate has a second trench.

8. A semiconductor manufacturing apparatus comprising:
a hot plate with a semiconductor wafer holding region;
a semiconductor wafer on the semiconductor wafer holding region;
at least one heater within the hot plate;
a trench plate over the hot plate, wherein the trench plate comprises a first trench extending partially through the trench plate from a first surface, wherein the trench plate also comprises a first opening extending fully through the trench plate from the first surface to a second surface, and a second opening extending fully through the trench plate from the first surface to the second surface, the first trench being located between the first opening and the second opening, the first opening and the second opening being laterally removed from the first trench; and
a cover plate over the trench plate.

9. The semiconductor manufacturing apparatus of claim 8, wherein the trench plate comprises polytetrafluoroethylene.

10. The semiconductor manufacturing apparatus of claim 8, wherein there is a single opening in the cover plate.

11. The semiconductor manufacturing apparatus of claim 10, wherein the single opening has a diameter of between about 20 mm and about 30 mm.

12. The semiconductor manufacturing apparatus of claim 8, wherein the cover plate has a second trench.

13. The semiconductor manufacturing apparatus of claim 12, wherein the first trench and the second trench are part of a plurality of trenches, the plurality of trenches being arranged around a central point of the cover plate.

14. A semiconductor manufacturing apparatus comprising:
a hot plate;
a semiconductor wafer on the hot plate;
at least one heater within the hot plate;
a trench plate over the hot plate, wherein the trench plate comprises a first trench extending partially through the trench plate from a first surface, wherein the trench plate also comprises a first opening extending fully through the trench plate from the first surface to a second surface, and a second opening extending fully through the trench plate from the first surface to the second surface, the first trench being located between the first opening and the second opening; and a cover plate over the trench plate, wherein the cover plate and the trench plate at least partially enclose a first region, and wherein an exhaust opening extends through the cover plate to the first region.

15. The semiconductor manufacturing apparatus of claim 14, wherein the trench plate comprises polytetrafluoroethylene.

16. The semiconductor manufacturing apparatus of claim 14, wherein the cover plate has a single opening over the trench plate.

17. The semiconductor manufacturing apparatus of claim 16, wherein the single opening has a diameter of between about 20 mm and about 30 mm.

18. The semiconductor manufacturing apparatus of claim 16, further comprising:

a semiconductor wafer holding region within the hot plate and adjacent to the semiconductor wafer; and a photoresist overlying the semiconductor wafer.

19. The semiconductor manufacturing apparatus of claim 16, further comprising a single pipe header attached to the single opening in the cover plate, wherein the single pipe header is the lone pipe header attached to the cover plate.

20. The semiconductor manufacturing apparatus of claim 14, wherein the cover plate has a second trench.

* * * * *